US008679865B2

(12) United States Patent
Yoon et al.

(10) Patent No.: US 8,679,865 B2
(45) Date of Patent: Mar. 25, 2014

(54) RESIN APPLICATION APPARATUS, OPTICAL PROPERTY CORRECTION APPARATUS AND METHOD, AND METHOD FOR MANUFACTURING LED PACKAGE

(75) Inventors: Sang Bok Yoon, Gyunggi-do (KR); Hae Yong Eom, Gyunggi-do (KR); Mi Hwa You, Gyeongsangnam-do (KR); Seung Min Hong, Gyunggi-do (KR); Sang Hoon Lee, Gyunggi-do (KR); Yong Gu Kim, Incheon (KR)

(73) Assignee: Samsung Electronics Co., Ltd., Seoul (KR)

( * ) Notice: Subject to any disclaimer, the term of this patent is extended or adjusted under 35 U.S.C. 154(b) by 211 days.

(21) Appl. No.: 12/869,355

(22) Filed: Aug. 26, 2010

(65) Prior Publication Data
US 2011/0053295 A1  Mar. 3, 2011

(30) Foreign Application Priority Data

Aug. 28, 2009 (KR) .................. 10-2009-0080146
Dec. 18, 2009 (KR) .................. 10-2009-0127374
Dec. 24, 2009 (KR) .................. 10-2009-0130966

(51) Int. Cl.
*H01L 21/66* (2006.01)
*G01R 31/26* (2006.01)

(52) U.S. Cl.
USPC .................. 438/15; 438/16; 438/26; 438/124

(58) Field of Classification Search
USPC .................. 438/15, 16, 29, 34, 35, FOR. 157, 438/FOR. 287, FOR. 416; 257/88, 98, 791, 257/798, E33.055, E33.059, E33.06, 257/E33.061; 313/409, 501–504; 427/8–10; 437/8–10
See application file for complete search history.

(56) References Cited

U.S. PATENT DOCUMENTS

| | | | |
|---|---|---|---|
| 5,640,875 A * | 6/1997 | Horde et al. ............... 72/405.13 |
| 6,507,049 B1 * | 1/2003 | Yeager et al. ................ 257/100 |
| 6,964,877 B2 * | 11/2005 | Chen et al. ..................... 438/20 |
| 2003/0080341 A1 * | 5/2003 | Sakano et al. ................. 257/79 |
| 2008/0137106 A1 * | 6/2008 | Ono ............................. 356/630 |
| 2009/0117672 A1 * | 5/2009 | Caruso et al. ..................... 438/7 |
| 2009/0134415 A1 * | 5/2009 | Morioka ......................... 257/98 |
| 2009/0286335 A1 | 11/2009 | Le Toquin |
| 2010/0181582 A1 * | 7/2010 | Li et al. ........................... 257/91 |

FOREIGN PATENT DOCUMENTS

| | | |
|---|---|---|
| JP | 2006-322499 | 11/2006 |
| KR | 10-2004-0086871 A1 | 10/2004 |
| KR | 10-2005-0042005 A | 5/2005 |
| KR | 10-0768884 B1 | 10/2007 |

OTHER PUBLICATIONS

Korean Office Action, with English Translation, issued in Korean Patent Application No. 10-2009-0080146, dated Jan. 31, 2011.

* cited by examiner

*Primary Examiner* — Colleen Matthews
*Assistant Examiner* — Quovaunda V Jefferson
(74) *Attorney, Agent, or Firm* — McDermott Will & Emery LLP

(57) ABSTRACT

A resin application apparatus includes: an optical property measurement unit measuring an optical property of light emitted from a light emitting diode (LED) chip which is mounted on a package body and to which transparent resin is not applied; and a resin application unit applying light conversion material-containing transparent resin to the LED chip in accordance with a resin application amount which is decided depending on the optical property measured by the optical measurement unit.

9 Claims, 21 Drawing Sheets

RESIN APPLICATION APPARATUS, OPTICAL PROPERTY CORRECTION APPARATUS AND METHOD, AND METHOD FOR MANUFACTURING LED PACKAGE

CROSS-REFERENCE TO RELATED APPLICATIONS

This application claims the priorities of Korean Patent Application Nos. 10-2009-0080146 filed on Aug. 28, 2009, 10-2009-0127374 filed on Dec. 18, 2009 and 10-2009-0130966 filed on Dec. 24, 2009, in the Korean Intellectual Property Office, the disclosures of which are incorporated herein by reference.

BACKGROUND OF THE INVENTION

1. Field of the Invention

The present invention relates to a resin application apparatus, an optical property correction apparatus and method, and a method for manufacturing a light emitting diode (LED) package, and more particularly, to a resin application apparatus which reduces chromaticity distribution and realizes a target chromaticity, an optical property correction apparatus and method which reproduces a target chromaticity in order to improve a chromaticity distribution, and a method for manufacturing a an LED package which enhances process efficiency.

2. Description of the Related Art

In general, an LED package used as a white light emitting device or the like is implemented by applying transparent resin to protect a light emitting diode (LED) chip mounted on a package body and an electrode connection portion (for example, a bump ball or bonding wire). The transparent resin includes phosphors dispersed therein, depending on the color of light which is to be emitted and implemented by the LED package. The color of light emitted from the LED package has a chromaticity which is decided depending on a mixing ratio of various phosphors and resin (for example, silicon resin) and a content ratio of phosphors when various kinds of phosphors are used. In this case, chromaticity distribution occurs among LED package products having the same target color. Therefore, although if the same light is intended to be emitted, a chromaticity distribution of the light emitted from the LED package products may occur due to process variations which inevitably occur during the LED package manufacturing process, and the chromaticity of light emitted from the varying LED package products may therefore deviate from a target chromaticity range.

FIG. 1 is a flow chart showing a method for manufacturing an LED package according to the related art. Referring to FIG. 1, die bonding is performed to mount and fix an LED chip to a package body or a mounting region of the package body (S11). Then, wire bonding for electrode connection is performed to mount the LED chip on the package body (S13). Subsequently, a dispensing process is performed to dispense transparent resin having phosphors dispersed therein onto the LED chip (S15), and the dispensed resin is cured (S17). Then, the package array is separated into individual LED packages. Finally, the LED packages are tested to determine whether they are a failed product or not (S19). In the testing operation (S19), the optical properties of the individual LED packages are tested.

Although the LED packages are manufactured by the same process, chromaticity, among the optical properties of the LED packages, may have a distribution due to a variety of causes. Accordingly, LED packages deviating from a desired product specification may be produced, which causes a yield reduction and a manufacturing cost increase.

FIG. 2 is a graph showing a chromaticity distribution of the same LED packages and failure occurrence on the Commission Internationale de l'Eclairage (CIE) 1931 chromaticity system. Referring to FIG. 2, the same LED packages with the same model name exhibit a chromaticity distribution, and may deviate from a target chromaticity region. In this case, a failure may occur. Such a chromaticity distribution of the LED packages may be caused by an optical property distribution of LED chips (for example, a distribution of the peak wavelengths or the dominant wavelengths of light emitted from the LED chips) or a property distribution or structural distribution of package elements other than the LED chips.

LED lighting is environmentally friendly as it does not use mercury. Furthermore, it is expected that the LED lighting will contribute to energy conservation. Accordingly, LED lighting is considered to be a main light source which will change the existing lighting market. In accordance with such a trend, many countries such as the United States are promoting the standardization of LED lighting technology so as to spread the acceptance of LED lighting. Therefore, it is important to manufacture an LED package which is capable of satisfying international standards related to LED lighting.

As described with reference to FIG. 1, the testing of the optical property of the LED package in the LED package manufacturing process is performed after the package array is separated into individual LED packages. This may reduce the efficiency of the optical property test operation. As a result, the productivity of the LED package manufacturing process may decrease.

FIG. 3 is a plan view of an LED package immediately before a package array is cut into separate LED packages in the LED package manufacturing process, that is, before a package singulation operation. Referring to FIG. 3, an LED chip 3 is attached to a package body 2 installed in a lead frame 1, and electrodes 5 of the lead frame 1 (or electrodes of the package body 2) are bonded by a wire 4. Transparent resin containing phosphors is applied onto the package body 2 so as to cover the LED chip 3 and the wire 4. A plurality of LED packages 6 are connected in an array by the lead frame 1. FIG. 3 illustrates one LED package region in such an array. In a subsequent process, the lead frame 1 is cut so that each package region may obtain a singulated LED package 6. A voltage is applied to the singulated LED package 6 such that the LED package 6 may emit light, and an optical sensor or the like is used to measure the chromaticity of the LED package 6. Depending on the application amount of the phosphor-containing resin, the chromaticity of the light (for example, white light) emitted from the LED package 6 may differ. The chromaticity of the LED package 6 is one of the most important specifications of the LED package 6. When the chromaticity of the LED package 6 deviates from a predetermined range, the LED package 6 becomes a failed product.

Referring to FIG. 3, both electrodes of the LED package 6 are electrically connected by the lead frame 1. Therefore, before the LED package 6 is separated from the lead frame 1, the LED package 6 cannot emit light. As a result, before the LED package 6 is separated from the lead frame 1, the chromaticity of the LED package 6 cannot be measured. Accordingly, when the optical properties of the LED packages 6 are to be tested, the LED packages 6 should be separated from the lead frame 1, and a voltage should be applied to each of the LED packages 6 to test the optical properties thereof. As such, since the optical property test for the plurality of LED packages 6 cannot be performed on the lead frame 1 and should be performed for each of the singulated LED packages 6, the operation efficiency inevitably decreases, thereby causing a reduction in productivity. Furthermore, as a result of the optical property test, it may be determined that the amount of phosphors contained in the phosphor-containing resin is insufficient. In this case, there are difficulties in automating and performing a process for supplementing the phosphors contained within the LED package 6.

SUMMARY OF THE INVENTION

According to an aspect of the present invention, there is provided a resin application apparatus including: an optical property measurement unit measuring an optical property of light emitted from a light emitting diode (LED) chip which is mounted on a package body and to which transparent resin is not applied; and a resin application unit applying light conversion material-containing transparent resin to the LED chip in accordance with a resin application amount which is decided depending on the optical property measured by the optical measurement unit.

A package array in which a plurality of LED packages are arranged in an array may be provided to the optical property measurement unit, a positive electrode and a negative electrode of each LED package in the package array being electrically insulated from each other. The respective LED packages in the package array may be electrically insulated from each other.

The optical property measurement unit may measure a wavelength of the light emitted from the LED chip. The optical property measurement unit may measure a dominant wavelength or peak wavelength of the light emitted from the LED chip. As the wavelength measured by the optical property measurement unit is increased, the amount of light conversion material-containing transparent resin to be applied by the resin application unit may increase. The optical property measurement unit may also measure the chromaticity of the light emitted from the LED chip.

The resin application unit may include: a resin application amount calculation unit calculating an appropriate resin application amount depending on the optical property of the light emitted from the LED chip, which is measured by the optical property measurement unit; and a dispenser unit dotting the light conversion material-containing transparent resin onto the LED chip in accordance with the resin application amount calculated by the resin application amount calculation unit.

According to another aspect of the present invention, there is provided a method for manufacturing an LED package, including: mounting an LED chip on a package body; measuring an optical property of the light emitted from the LED chip mounted on the package body; and deciding upon a resin application amount depending on the measured optical property, and applying light conversion material-containing transparent resin to the LED chip in accordance with the decided resin application amount. The method may further include curing the transparent resin applied to the LED chip.

A package array in which a plurality of LED packages are arranged in an array may be provided for measuring the optical property of the light, a positive electrode and a negative electrode of each LED package in the package array being electrically insulated from each other. The respective LED packages in the package array may be electrically insulated from each other.

The measuring of the optical property may include measuring a wavelength of the light emitted from the LED chip. The wavelength of the light emitted from the LED chip may include a dominant wavelength and a peak wavelength. As the wavelength measured in the measuring of the optical property is increased, the amount of resin to be applied in the applying of the light conversion material-containing transparent resin may increase. The measuring of the optical property may include measuring the chromaticity of the light emitted from the LED chip.

According to another aspect of the present invention, there is provided an optical property correction apparatus of an LED package, including: an optical property measurement unit measuring a chromaticity of light emitted from the LED package; a control unit comparing the chromaticity measured by the optical property measurement unit with a predetermined target chromaticity, and calculating an additional dispensing amount; and a correction unit dispensing phosphor-containing resin to the LED package as much as the additional dispensing amount. The LED package may be provided to the optical property measurement unit in a state in which the phosphor-containing resin is not yet cured.

The optical property correction apparatus may further include a transfer unit transferring the LED package to the correction unit from the optical property measurement unit. The optical property correction apparatus may further include a primary dispensing unit dispensing phosphor-containing resin to the LED package, before the chromaticity of light emitted from the LED package is measured. The optical property correction apparatus may further include a transfer unit sequentially transferring the LED package to the primary dispensing unit, the optical property measurement unit, and the correction unit. The optical property correction apparatus may further include a power supply unit applying an electrical signal to the LED package.

The correction unit may have higher dispensing resolution than the primary dispensing unit. A package array in which a plurality of LED packages are arranged in an array may be provided to the optical property measurement unit, a positive electrode and a negative electrode of each LED package in the package array being electrically insulated from each other. The respective LED packages may be electrically insulated from each other.

According to another aspect of the present invention, there is provided an optical property correction method of an LED package, including: applying an electrical signal to the LED package, and measuring a chromaticity of light emitted from the LED package; calculating an additional dispensing amount of phosphor-containing resin by comparing the measured chromaticity with a predetermined target chromaticity; and dispensing phosphor-containing resin to the LED package in an amount as much as the calculated additional dispensing amount.

The method may further include primarily dispensing the phosphor-containing resin to the LED package, before the measuring of the chromaticity. In the calculating of the additional dispensing amount, the additional dispensing amount of phosphor-containing resin may be decided so that the measured chromaticity falls within a target chromaticity range. A package array in which a plurality of LED package are arranged in an array may be provided for measuring the chromaticity of light, a positive electrode and a negative electrode of each LED package in the package array being electrically insulated from each other. The respective LED packages may be electrically insulated from each other.

The method may further include presetting an additional dispensing amount of phosphor-containing resin for moving the measured chromaticity to the target chromaticity, before the measuring of the chromaticity of light emitted from the LED package.

The presetting of the additional dispensing amount of phosphor-containing resin may include: a first operation of measuring a chromaticity of light emitted from the LED package to which phosphor-containing resin is primarily dispensed; a second operation of additionally dispensing a constant fine amount of phosphor-containing resin to the LED package; a third operation of measuring a chromaticity of light emitted from the LED package to which the constant fine amount of phosphor-containing resin is dispensed; when the chromaticity measured in the third operation does not reach the target chromaticity, repeating the second and third operations until the chromaticity measured in the third operation reaches the target chromaticity; and setting an additional dispensing amount of phosphor-containing resin for moving the measured chromaticity to the target chromaticity, by using the correlation between the amount of phosphor-containing resin and the chromaticity measured when the chromaticity reaches the target chromaticity.

According to another aspect of the present invention, there is provided a method for manufacturing an LED package, including: attaching LED chips to a plurality of package bodies of a package array having a structure in which the plurality of package bodies are arranged, a positive electrode and a negative electrode of each package body in the package array being electrically isolated from each other; forming a plurality of LED packages by dispensing phosphor-containing resin to the respective package bodies having the LED chip attached thereto; inspecting the optical properties of the respective LED packages in a state in which a voltage is applied to the respective LED chips of the package array to emit light; and singulating the LED packages by separating the LED packages from the package array.

The method may further include packing the singulated LED packages, after the singulating of the LED packages. All electrodes of the package array which are connected to electrodes of the respective LED chips may be electrically isolated from each other. The method may further include supplementing phosphor to an LED package in which the amount of phosphor is determined to be insufficient in the inspecting of the optical properties. The package array may include a lead frame having a plurality of package bodies installed therein. The package array may include a substrate having a plurality of LED chips mounted thereon.

The LED chips may be electrically connected to the electrodes of the corresponding package bodies through wire bonding. The method may further include inspecting whether a failure occurs in the wire bonding or not. The LED chips may be electrically connected to the electrodes of the package bodies through flip-chip bonding.

The inspecting of the optical properties may be performed by using a probe card including a plurality of probes which come in contact with the electrodes of the package array to apply a voltage thereto. The inspecting of the optical properties may include inspecting the optical properties of the plurality of LED packages at the same time in a state in which a light receiving array including a plurality of light inspection units is positioned close to the package array.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
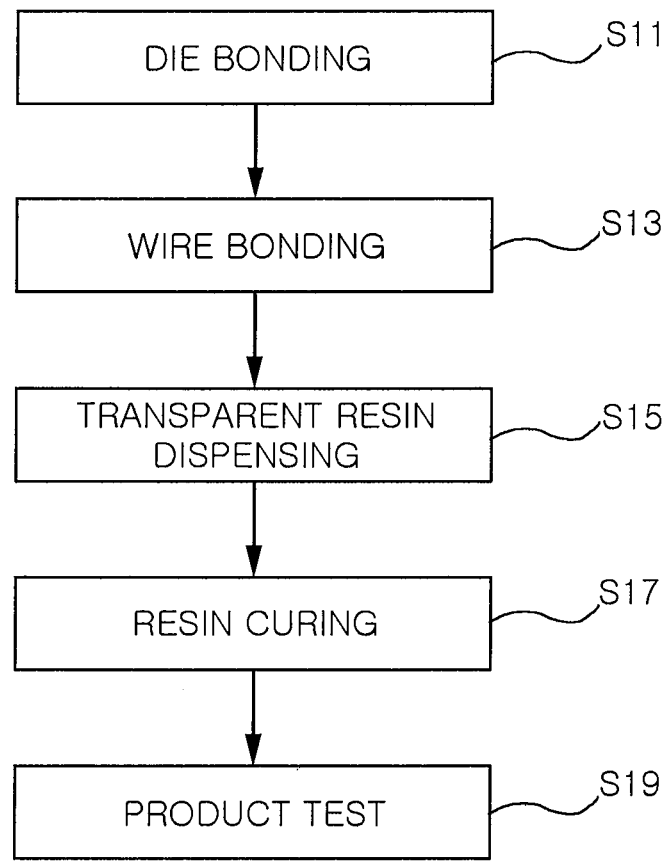
FIG. 1 is a flowchart showing a method for manufacturing an LED package according to the related art.
Figure 2:
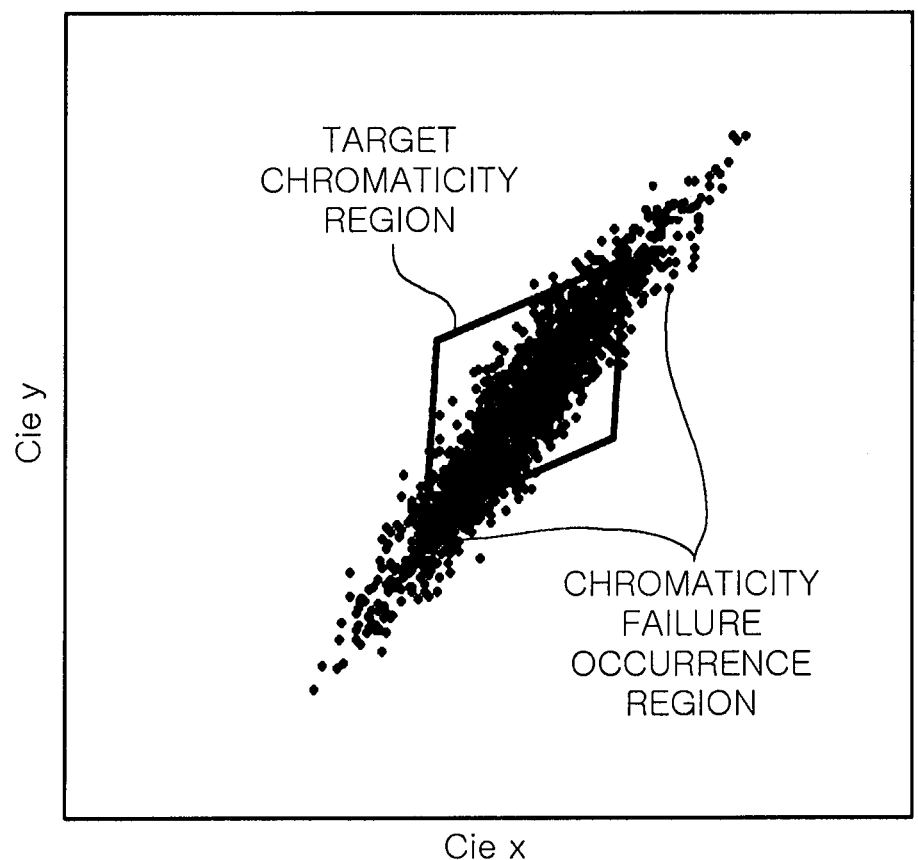
FIG. 2 is a diagram showing a chromaticity distribution of light emitted from LED packages according to the related art.
Figure 3:
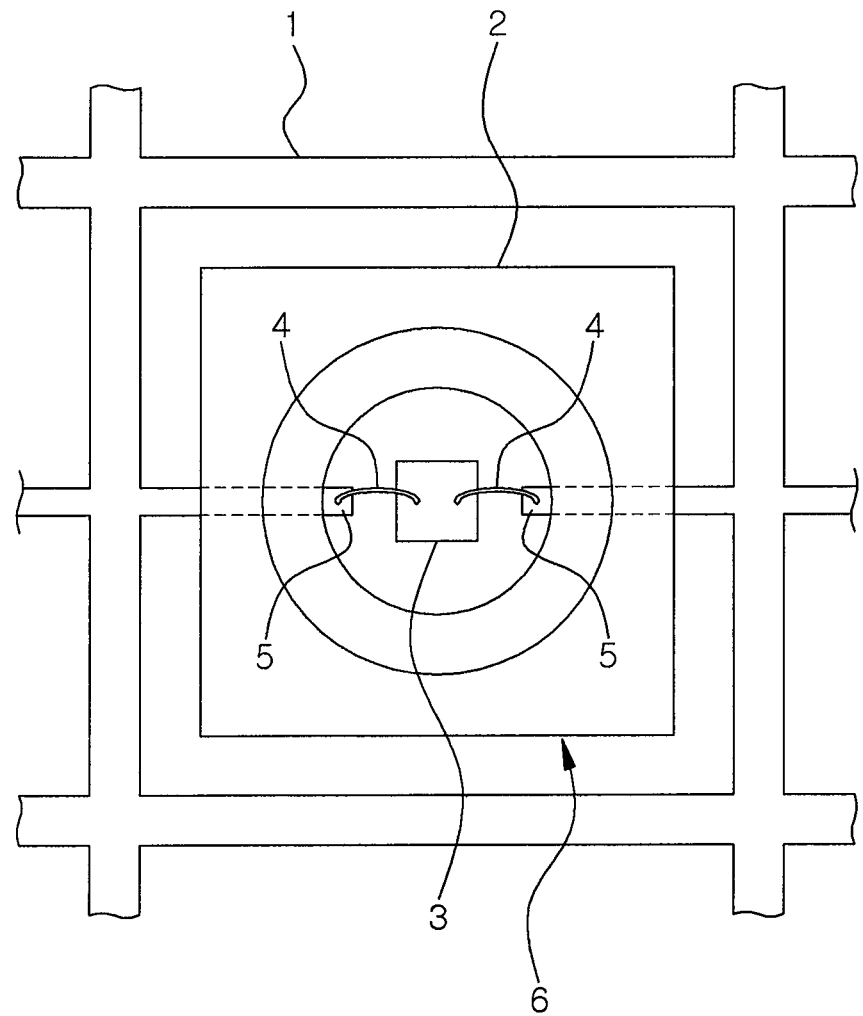
FIG. 3 is a plan view of an LED package immediately before a package array is cut into separate LED packages in the LED package manufacturing process according to the related art.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

Figure 4:
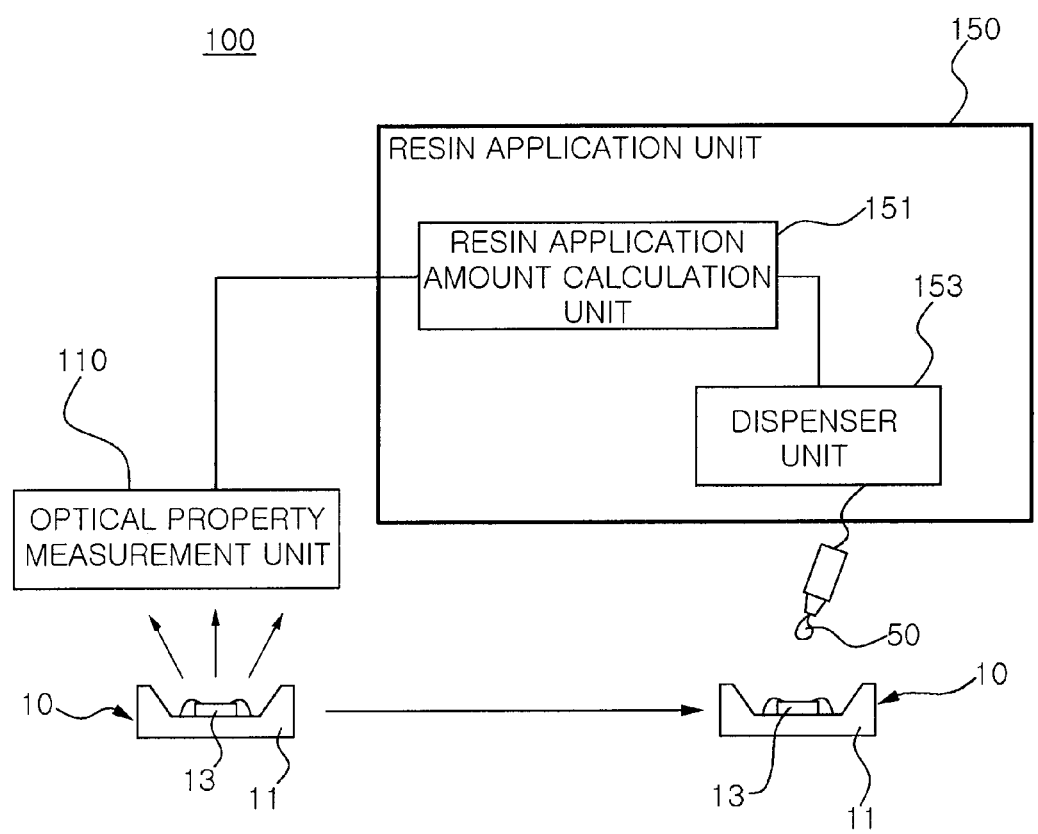
FIG. 4 is a diagram schematically illustrating a resin application apparatus according to an embodiment of the present invention.

FIG. 4 is a diagram schematically illustrating a resin application apparatus according to an embodiment of the present invention. The resin application apparatus 100 may be applied to a package structure 10 having an LED chip 13 mounted on a package body 11. Referring to FIG. 4, the resin application apparatus 100 includes an optical property measurement unit 110 and a resin application unit 150. The optical property measurement unit 110 measures the optical properties of light emitted from the LED chip 13 mounted on the package body 11. In particular, the optical property measurement unit 110 may measure a wavelength such as the dominant wavelength or peak wavelength of the LED chip 13. The resin application unit 150 decides upon an amount of transparent resin 50 to be applied, depending on the optical properties measured by the optical property measurement unit 110, and then applies the transparent resin 50 to the LED chip 13 in an amount equal to the decided upon application amount.

In the embodiment of the present invention, the optical property data such as the wavelength or chromaticity of the LED chip 13 measured by the optical property measurement unit 110 may be transferred to the resin application unit 150. The resin application unit 150 may include a resin application amount calculation unit 151 and a dispenser unit 153. The resin application amount calculation unit 151 may calculate a proper resin application amount depending on the transferred optical property data, and the dispenser unit 153 may dot the light conversion material-containing transparent resin 50 onto the LED chip 13 in accordance with the resin application amount calculated by the resin application amount calculation unit 151. The light conversion material contained in the transparent resin 50 refers to a material such as a phosphor that is excited by light emitted from an LED chip and emits a different wavelength of light.

As such, the optical properties of the light emitted from the LED package structure 10 before the resin application are measured, and the light conversion material-containing transparent resin is applied to the LED chip 13 in accordance with the resin application amount decided by the measurement data. Then, it is possible to reduce the chromaticity distribution of light emitted from the final LED package products having the resin applied thereto. Therefore, the failure rate of the LED packages decreases, and the production yield of the LED packages increases.

Despite the optical property distribution of light emitted from individual LED chips, the same resin application amount has been applied in the related art. Therefore, light emitted from final LED packages inevitably exhibits a chromaticity distribution to a considerable extent. In this embodiment of the present invention, however, the resin application amount is differently applied depending on the optical property distribution of the light emitted from the LED chips 13. Therefore, it is possible to reduce the chromaticity distribution of the final LED package products. This is because the chromaticity of the light emitted from the final LED packages may differ depending on the resin application amount. For example, as the application amount of resin containing light conversion material such as phosphor increases, the x coordinate (cie x) and the y coordinate (cie y) of the chromaticity of the light emitted from the final LED package may increase.

Figure 5:
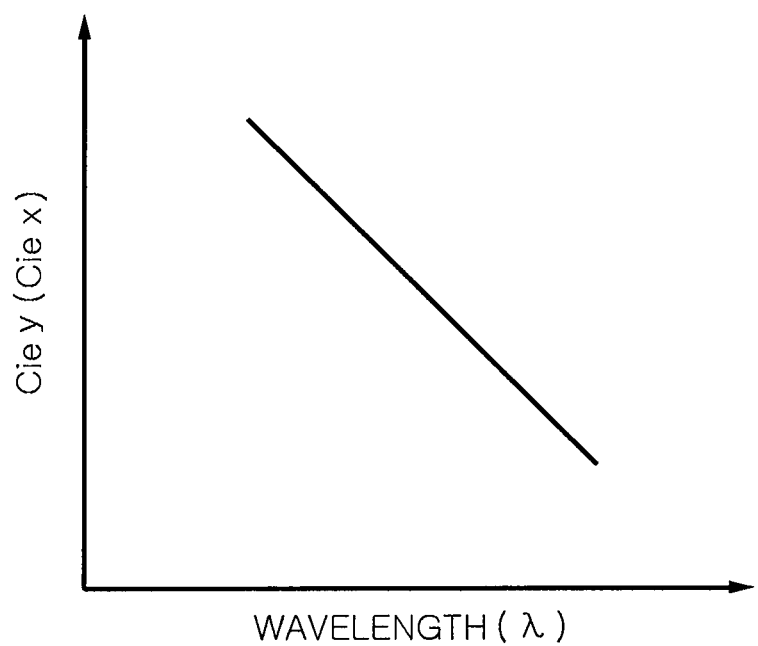
FIG. 5 is a graph showing chromaticity variations in an LED package depending on the wavelength of light emitted from an LED chip with respect to the same resin application amount.

Referring to FIG. 5, when it is assumed that the amount of resin to be applied to the respective LED package products is constant, the x coordinate (cie x) and the y coordinate (cie y) of the chromaticity coordinate system (for example, the CIE 1931 chromaticity coordinate system) may decrease as the wavelength (dominant wavelength or peak wavelength) λ of the light emitted from the LED chip 13 increases. Therefore, when it is determined that the wavelength λ is relatively large, after the optical property of the light emitted from the LED chip is measured, the resin application amount may be relatively increased. On the other hand, when it is determined that the wavelength λ is relatively small, the resin application amount may be relatively reduced. Then, it is possible to constantly maintain the chromaticities of the final LED packages. In this case, as the wavelength λ of the LED chip 13 measured by the optical property measurement unit 110 is large, the resin application amount by the resin application unit 150 increases.

Figure 6:
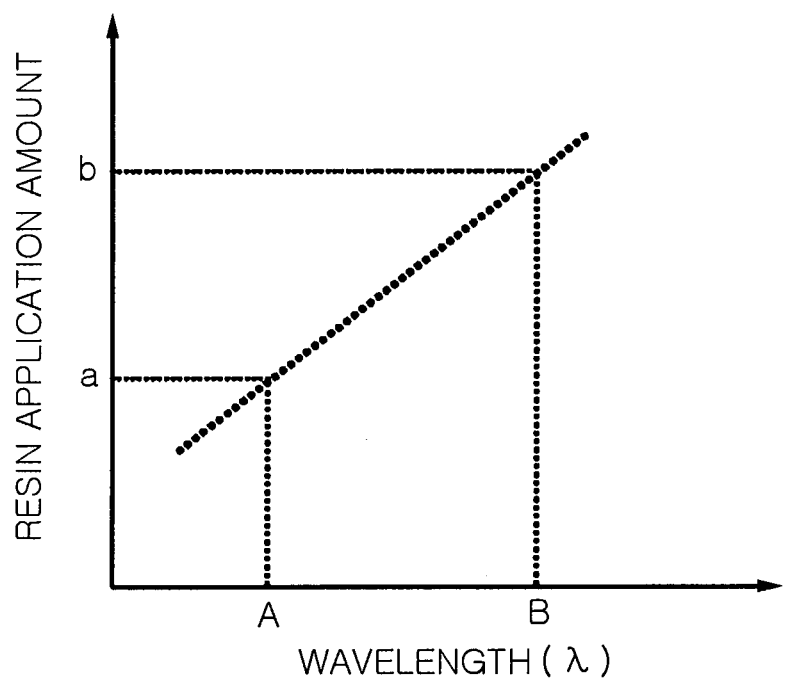
FIG. 6 is a graph showing a resin application amount depending on the wavelength of light emitted from an LED chip in the resin application apparatus according to the embodiment of the present invention.

For example, referring to FIG. 6, a resin application amount 'a' may be applied to an LED chip having a wavelength (dominant wavelength or peak wavelength) of 'A' nm, and a resin application amount 'b' may be applied to an LED chip having a wavelength of 'B' nm. The relationship between the wavelength of an LED chip and a proper resin application amount (for example, a resin application amount satisfying a target chromaticity) as shown in FIG. 6 may be previously set in such a manner that the proper resin application amount is automatically calculated in accordance with the measurement data of the optical property measurement unit 110.

The optical property measurement unit 110 may measure the chromaticity of the LED chip 13 instead of or with the wavelength of the light emitted from the LED chip 13. The dominant wavelength may be calculated from the measured chromaticity of the LED chip 13.

Figure 7:
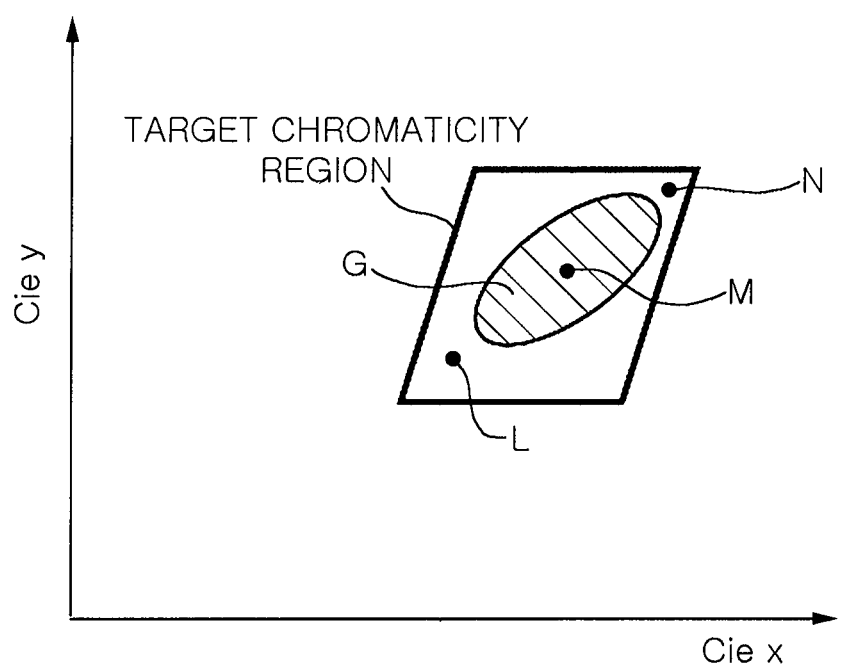
FIG. 7 is a diagram showing a chromaticity distribution of light emitted from LED packages manufactured according to the embodiment of the present invention.

Referring to FIG. 7, when the resin application apparatus 100 according to the embodiment of the present invention is used to manufacture LED packages, it is possible to reduce the chromaticity distribution of final LED package products such that the chromaticity of the final LED package products falls within a target chromaticity region. Furthermore, the resin application amount may be finely controlled in order to reduce the chromaticity distribution into an optical chromaticity region G within the target chromaticity region. In other words, a ratio of products M positioned within the optimal chromaticity region G may be increased, and a ratio of products L and N deviating from the optimal chromaticity region G but staying in the target chromaticity region may be reduced.

Figure 8:
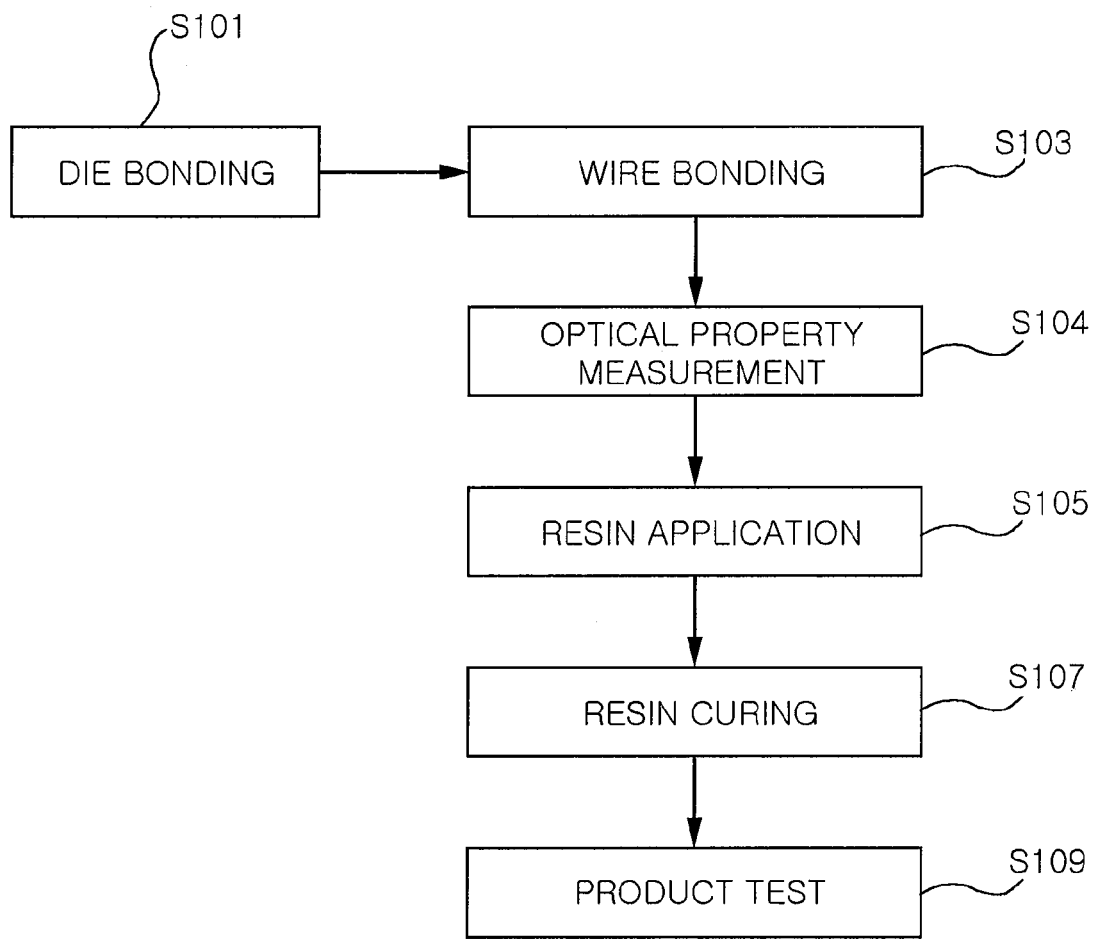
FIG. 8 is a flow chart showing a method for manufacturing an LED package according to another embodiment of the present invention.

FIG. 8 is a flowchart showing a method for manufacturing an LED package according to another embodiment of the present invention. In the package manufacturing process of FIG. 8, an optical property measurement operation (S104) and a resin application operation (S105) may be performed using the above-described resin application apparatus 100.

Referring to FIG. 8, an LED chip is die-bonded to a package body (S101), and wire bonding for electrode connection is performed to mount the LED chip on the package body (S103). Instead of the wire bonding, flip-chip bonding may be performed, in which the LED chip is inverted and connected to a bump ball or the like. Then, the optical property of the LED chip 13 is measured using the optical property measurement unit 110 illustrated in FIG. 4 (S104). The optical property may include a wavelength (dominant wavelength or peak wavelength) and chromaticity. The optical property measurement operation (S104) for the LED chip 103 may be performed in a state in which a plurality of LED package regions are connected in an array, for example, by a lead frame. As will be described below, even before the LED package regions are separated from the lead frame, a voltage may be applied to each of the LED packages so as to measure the optical property in such a state that the plurality of packages are connected in an array by the lead frame. That is because both electrodes (a positive electrode and a negative electrode) of the LED package are electrically separated from each other. In this case, the respective LED packages in the package array may be electrically insulated from each other.

Subsequently, a resin application amount is decided upon depending on the measured optical property of the LED chip 13, and light conversion material-containing transparent resin is applied to the LED chip 13 in an amount equal to the decided resin upon application amount (S105). In this case, the wavelength-resin application amount relationship of the LED chip 13 as shown in FIG. 6 may be utilized. Next, the transparent resin applied to the LED chip 13 is cured (S107). Then, a final product test is performed (S108).

According to another embodiment of the present invention, an optical property correction apparatus and method of an LED package is provided. The optical property correction apparatus and method may be applied to the process of dispensing transparent resin to an LED package after the wire bonding process is completed. Before the process of curing the phosphor-containing resin is undertaken, the chromaticity of the LED package into which the phosphor-containing resin is dispensed may be measured, and the phosphor-containing resin may be additionally dispensed so that the chromaticity falls within a target chromaticity range. Then, the chromaticity of the LED package may be corrected. Accordingly, the chromaticity distribution of the LED package may be improved.

Figure 9:
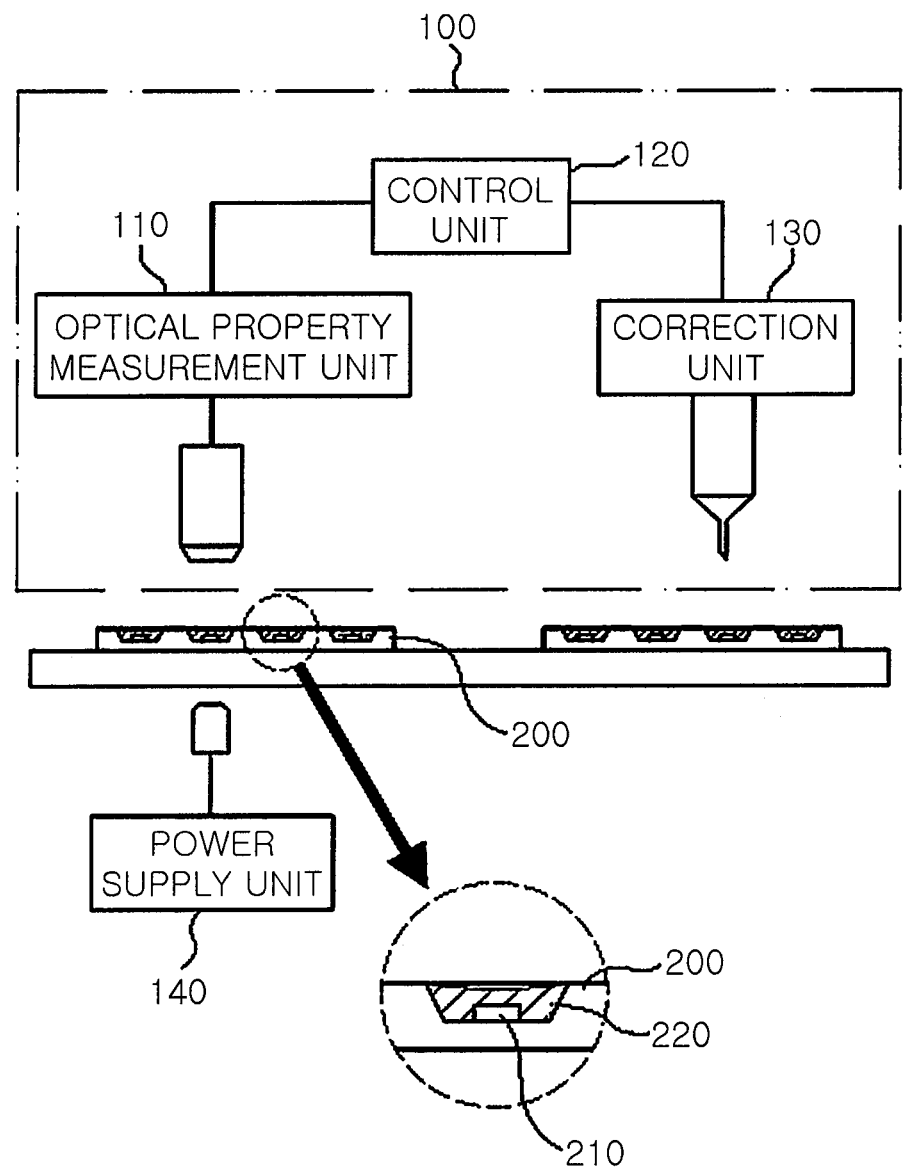
FIG. 9 is a block diagram illustrating the configuration of an optical property correction apparatus of the LED package according to another embodiment of the present invention.

FIG. 9 is a block diagram illustrating the configuration of the optical property correction apparatus of the LED package according to the embodiment of the present invention. The optical property correction apparatus 100 of the LED package may perform an additional process between a dispensing process (primary dispensing process) and a curing process in a semiconductor packaging process.

Referring to FIG. 9, the optical property correction apparatus 100 of the LED package includes an optical property measurement unit 110, a control unit 120, a correction unit 130, and a power supply unit 140. The optical property correction apparatus 100 may be additionally installed in a general dispensing device (not shown). In this case, the optical correction apparatus 100 may perform an optical property correction operation on an LED package to which phosphor-containing resin has already been primarily dispensed.

Specifically, the optical property measurement unit 110 may measure the optical property of the LED package to which the phosphor-containing resin is primarily dispensed, in particular, the chromaticity of the LED package. The phosphor-containing resin may be prepared by mixing transparent resin and various phosphors depending on the color of the LED package which is to be realized. The chromaticity of light emitted from the LED package may be decided by the mixing ratio of phosphors to transparent resin, a wavelength band, and a dotting height. Since the mixing ratio of phosphors and transparent resin and the wavelength band are decided at the initial stage of the LED package manufacturing process, it is difficult to change the chromaticity during the process by controlling the mixing ratio or wavelength band. However, the chromaticity may be finely controlled by the dotting height.

In this embodiment of the present invention, the chromaticity of the LED package into which the phosphor-containing resin has already been primarily dispensed is changed into a target chromaticity by controlling the dotting height. To accomplish this, the optical property measurement unit 110 measures the chromaticity of light emitted from the LED package transferred by a transfer unit (not shown). At this time, the power supply unit 140 applies an electrical signal (driving voltage) to the LED package. The LED package may include an LED chip 120 die-bonded to a package body 200, and the phosphor-containing resin 200 has been primarily dispensed to the LED package, as described above. Meanwhile, a package array in which a plurality of LED packages are arranged in an array may be provided to the optical property measurement unit 110 for measuring the chromaticity of the light emitted from the LED packages in the package array. In this case, a positive electrode and a negative electrode of each LED package in the package array are electrically insulated from each other. The respective LED packages may be electrically insulated from each other. The optical property measurement 110 may measure the chromaticities of the respective LED packages, and may calculate a chromaticity distribution for a single array.

The control unit 120 calculates an additional dispensing amount of phosphor-containing resin such that the chromaticity measured by the optical property measurement unit 110 falls within a predetermined target chromaticity range. That is, the control unit 120 compares the measured chromaticity with the predetermined target chromaticity range and decides upon the additional dispensing amount of phosphor-containing resin depending on the chromaticity deviation. The control unit 120 controls the correction unit 130 to perform the additional dispensing of phosphor-containing resin. The process for deciding the additional dispensing amount of phosphor-containing resin to move the measured chromaticity to the target chromaticity range will be described below with reference to FIG. 14.

Although not shown, the optical property correction apparatus 10 of the LED further includes a transfer unit which transfers the LED packages to the correction unit 130 after the optical property measurement process is completed.

The correction unit 130 dispenses phosphor-containing resin to the LED package in an amount equal to (in an amount as much as) the decided additional dispensing amount of phosphor-containing resin decided by the control unit 120. The correction unit 130 should have a higher dispensing resolution than the dispensing device which primarily dispenses the phosphor-containing resin. That is because the measured chromaticity should be moved into the target chromaticity range through fine control.

Hereinafter, an optical property correction method of an LED package using the optical property correction apparatus 100 according to another embodiment of the present invention will be described with reference to FIG. 10.

Figure 10:
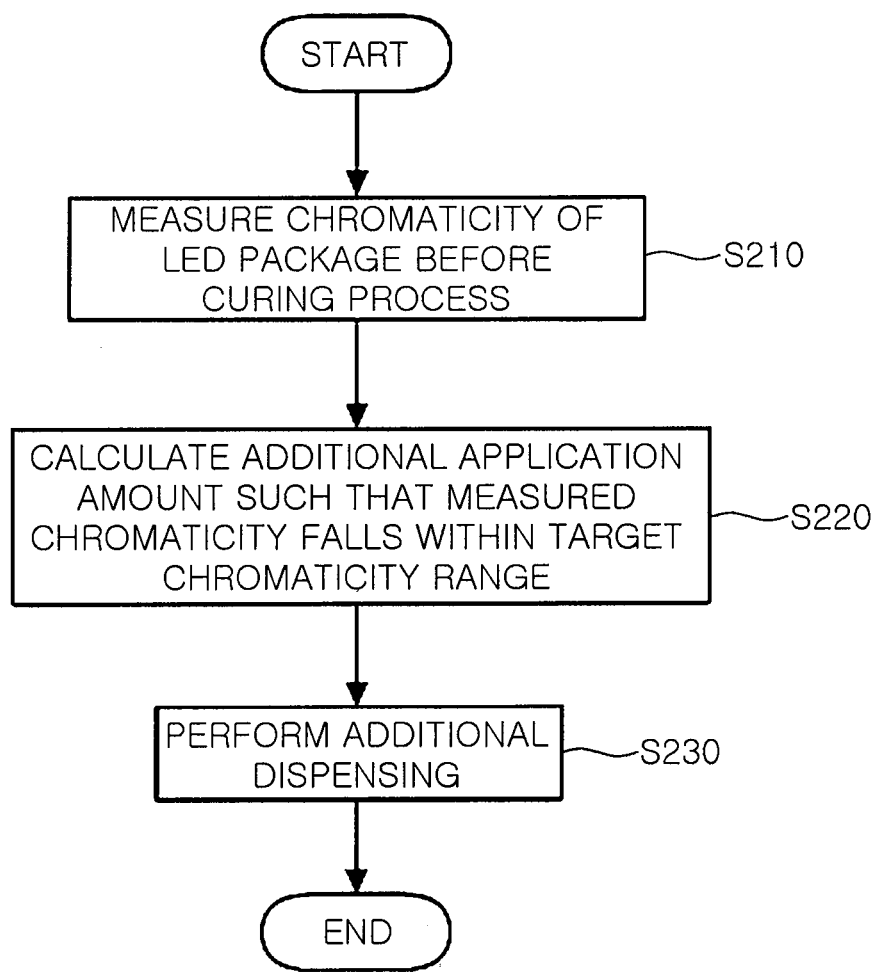
FIG. 10 is a flow chart explaining an optical property correction method of an LED package according to another embodiment of the present invention.

FIG. 10 is a flow chart explaining a process for correcting the optical properties of the LED package before the curing process in the optical property correction apparatus according to the embodiment of the present invention. Referring to FIG. 10, the optical property measurement unit 110 measures the chromaticity of light emitted from the LED package transferred by the transfer unit (not shown) (S210). At this time, the power supply unit 140 applies an electrical signal (driving voltage) to the LED package to which the phosphor-containing resin has been already primarily dispensed by the dispensing device, and the curing process has not been yet performed. The phosphor-curing resin may prepared by mixing transparent resin and various phosphors depending on the color of the LED package which is to be realized.

Then, the control unit 120 compares the chromaticity (hereafter, the measured chromaticity) obtained from the optical property measurement unit 110 with a predetermined target chromaticity and calculates an additional dispensing amount of phosphor-containing resin such that the measured chromaticity may fall within the target chromaticity range. At this time, the control unit 120 includes information on the additional dispensing amount of phosphor-containing resin which is previously set and decided upon depending on the measured chromaticity. For example, when the measured chromaticity is within or exceeds the target chromaticity range, the additional dispensing amount of phosphor-containing resin becomes zero.

Subsequently, the correction unit 130 injects the phosphor-containing resin to the LED package in amounts equal to the calculated additional dispensing amount of phosphor-containing resin (S230). At this time, the correction unit 130 is operated by the control of the control unit 120. Accordingly, the dotting height of the additionally dispensed amount of phosphor-containing resin on the LED package may be changed, and the measured chromaticity may be moved to the target chromaticity. Then, the curing process of the LED package is performed.

As described above, when the optical property of the LED package is corrected by the optical property correction apparatus according to the embodiment of the present invention before the curing process of the phosphor-containing resin, the target chromaticity may be accurately reproduced, and the chromaticity distribution may be improved.

Figure 11A:
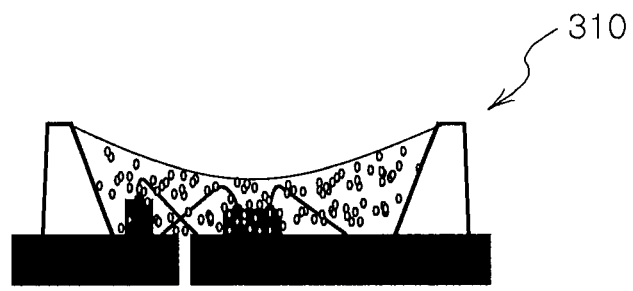
FIGS. 11A to 11C are diagrams showing examples in which the optical property correction method described with reference to FIG. 10 is actually applied.
Figure 11B:
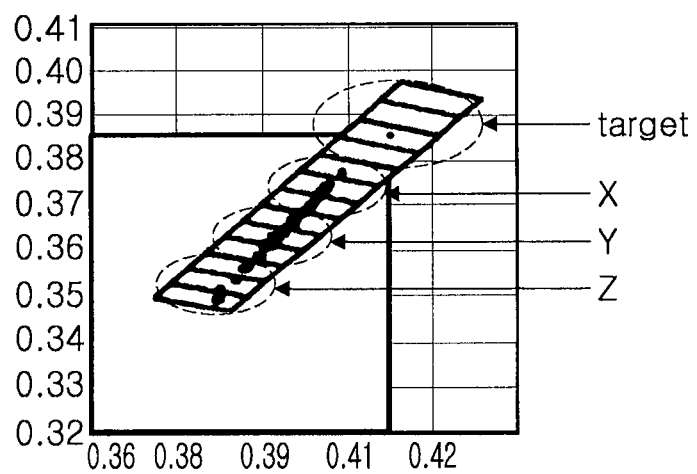
Figure 11C:
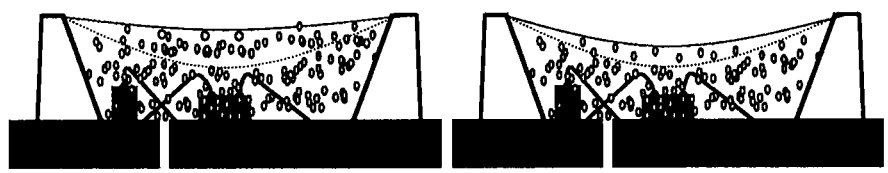

FIGS. 11A to 11C are diagrams showing examples in which the optical property correction method described with reference to FIG. 10 is actually applied. Referring to FIG. 11A, the LED package 310 to which the phosphor-containing resin has been primarily dispensed is transferred to a measurement position of the optical property measurement unit 110. Then, the optical property measurement unit 110 measures the chromaticity of the LED package 310. At this time, a plurality of LED packages 310 may be provided in an array. For convenience of description, however, it is assumed that two LED packages A and B are provided. The measurement results obtained by the optical property measurement unit 110 according to the embodiment of the present invention are provided as shown in FIG. 11B.

As shown in FIG. 11B, the chromaticities of the LED packages A and B are measured. In this case, since the chromaticity of the LED package B further deviates from the target chromaticity than the chromaticity of the LED package A, a larger additional dispensing amount of phosphor-containing resin needs to be applied to the LED package B. Therefore, the control unit 120 decides upon the additional dispensing amount of phosphor-containing resin depending on a deviation between the target chromaticity and the measured chromaticity, and controls the correction unit 130 to perform the additional dispensing of the phosphor-containing resin.

Referring to FIG. 11C, a larger additional dispensing amount of phosphor-containing resin is applied to the LED package B, because the deviation between the measured chromaticity and the target chromaticity in the LED package B is larger than that of the LED package A. Accordingly, although different additional dispensing amounts are applied to the LED packages A and B, the chromaticities of the LED packages A and B are moved into the target chromaticity range.

Figure 12:
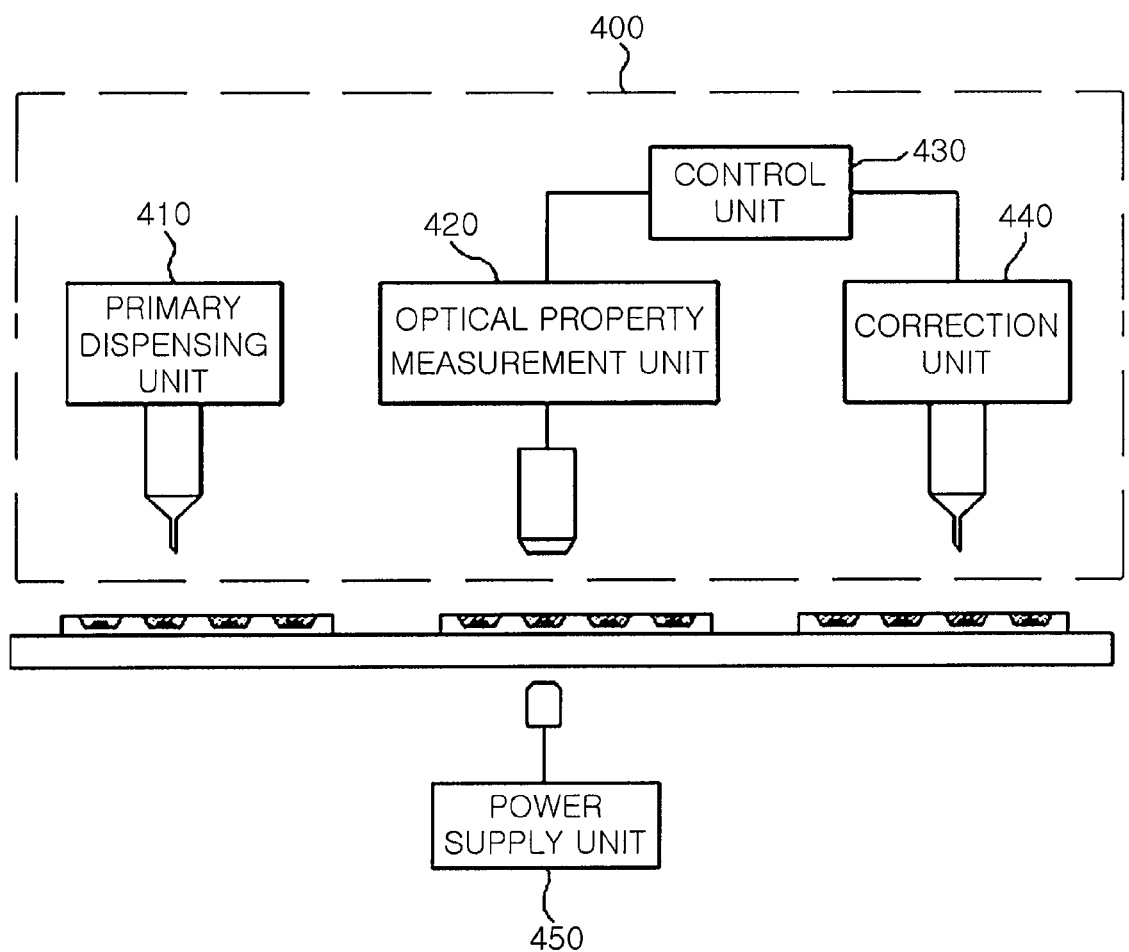
FIG. 12 is a block diagram schematically illustrating the configuration of an optical property correction apparatus of an LED package according to another embodiment of the present invention.

FIG. 12 is a block diagram schematically illustrating the configuration of an optical property correction apparatus of an LED package according to another embodiment of the present invention. The optical property correction apparatus 400 performs the dispensing process (the primary dispensing process) in the semiconductor packaging process.

Referring to FIG. 12, the optical property correction apparatus 400 of the LED package includes a primary dispensing unit 410, an optical property measurement unit 420, a control unit 430, a correction unit 440, and a power supply unit 450. The optical property correction apparatus 400 of the LED package may further include a transfer unit (not shown) for transferring the LED package to the respective units 410 to 440.

Specifically, the primary dispensing unit 410 dispenses phosphor-containing resin to an LED package after the wire bonding process is completed. At this time, the phosphor-containing resin may be dispensed in an amount sufficient to seal a light emitting device (LED chip). The phosphor-containing resin may be prepared by mixing transparent resin and various phosphors depending on the color of the light emitting device which is to be realized.

The optical property measurement unit 420 measures the optical property of the LED package to which the phosphor-containing resin has been primarily dispensed. The optical property may include a CIE chromaticity which is decided by the mixing ratio of phosphors to transparent resin, a wavelength band, and a dotting height. Since the mixing ratio of phosphors to transparent resin and the wavelength band are decided at the initial stage of the LED packaging process, it is difficult to change the chromaticity thereof during the process, by using the mixing ratio or wavelength band. However, the chromaticity may be finely controlled by the dotting height. Therefore, the dotting height may be used to correct the chromaticity.

When the LED package to which the phosphor-containing resin has been primarily dispensed is transferred through the transfer unit, the optical property measurement unit 420 measures the chromaticity of light emitted from the LED package. At this time, the power supply unit 450 applies an electrical signal to the LED package. A package array in which a plurality of LED packages are arranged in an array may be provided to the optical property measurement unit 420. In this case, the positive electrode of each LED package is insulated from its negative electrode. The respective LED packages in the package array may be insulated from each other. The optical property measurement unit 420 may measure the chromaticity of the respective LED packages and obtain a chromaticity distribution for an array.

The control unit 430 calculates an additional dispensing amount of phosphor-containing resin of phosphor-containing resin such that the chromaticity (hereinafter, referred to a measured chromaticity) obtained by the optical property measurement unit 420 falls within a target chromaticity range. That is, the control unit 430 compares the measured chromaticity with a predetermined target chromaticity and decides upon the additional dispensing amount of phosphor-containing resin depending on the deviation between the measured chromaticity and the predetermined target chromaticity. Then, the control unit 430 controls the correction unit 440 to perform the additional dispensing of phosphor-containing resin.

The correction unit 440 dispenses the phosphor-containing resin to the light emitting device package in an amount equal to the additional dispensing amount. The correction 440 should have a higher dispensing resolution than the primary dispensing unit 410. That is because the measured chromaticity of the LED package deviating from the target chromaticity should be moved into the target chromaticity range through fine control of the dotting height.

Figure 13:
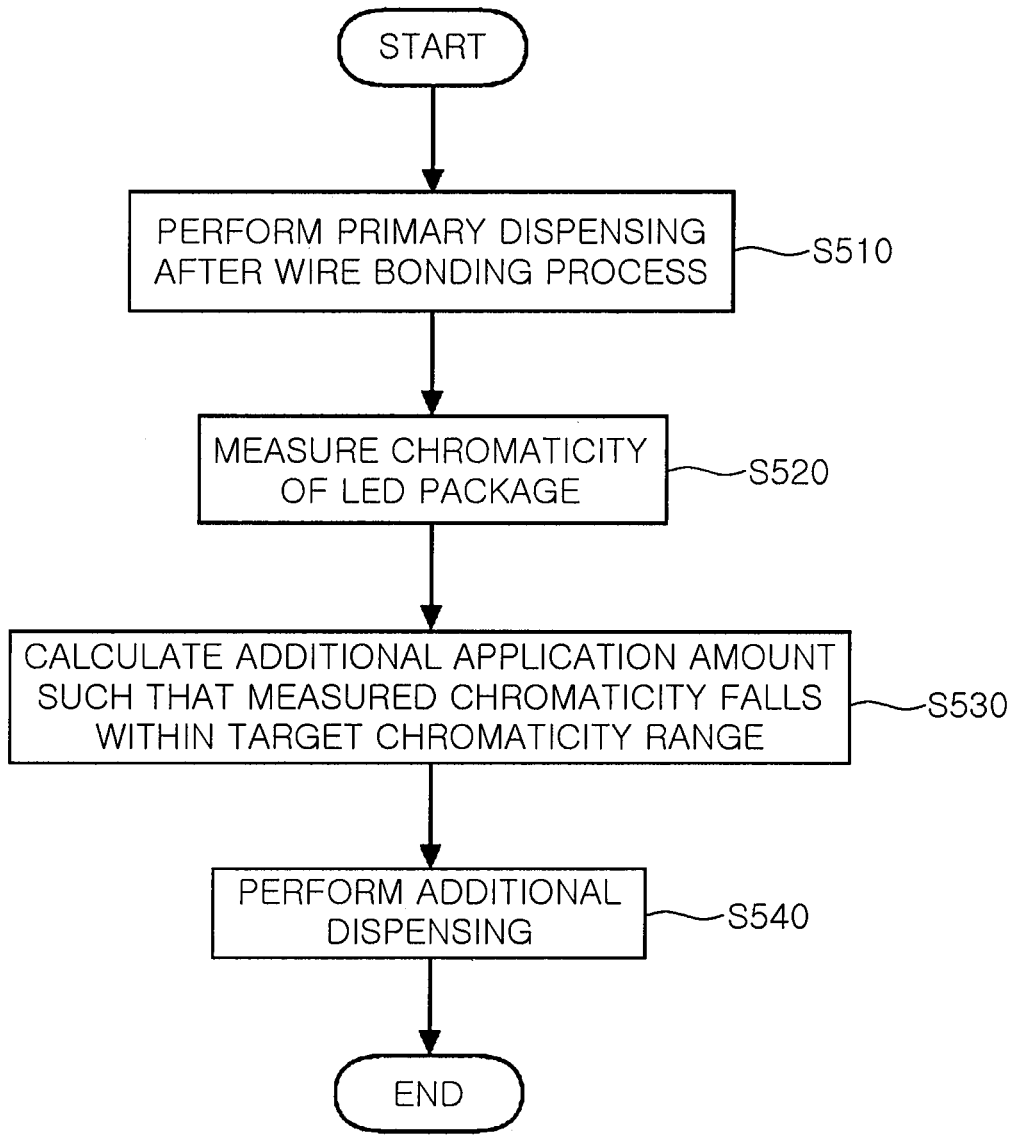
FIG. 13 is a flow chart explaining an optical property correction method of an LED package according to another embodiment of the present invention.

Referring to FIG. 13, a process for correcting the optical properties of the LED package in the optical property correction apparatus 400 configured in such a manner will be described.

FIG. 13 is a flowchart explaining the optical property correction method of the LED package using the optical property correction apparatus 400 of FIG. 12, before the curing process. The optical property correction method shown in FIG. 13 is the same as the optical property correction method described with reference to FIGS. 10 and 11, except that the optical property correction apparatus 400 is used to perform the primary dispensing.

Referring to FIG. 13, the primary dispensing unit 410 dispenses phosphor-containing resin to an LED package transferred by the transfer unit (S510), after the wire bonding process. At this time, the primary dispensing unit 410 includes at least one needle through which the phosphor-containing resin is jetted and which is set in such a manner as to jet a constant amount. The phosphor-containing resin may be prepared by mixing transparent resin and various phosphors depending on the color of the LED package which is to be realized.

Then, the optical property measurement unit 420 measures the chromaticity of light emitted from the LED package transferred from the primary dispensing unit 410 (S520). At this time, the power supply unit 450 applies an electrical signal to the LED package. The optical property measurement unit 420 transfers the measured chromaticity to the control unit 430.

The control unit 430 compares the chromaticity measured by the optical property measurement unit 420 with a predetermined target chromaticity, and calculates an additional dispensing amount of phosphor-containing resin such that the measured chromaticity falls within the target chromaticity range (S530). The control unit 430 may include preset information on the additional dispensing amount of phosphor-containing resin for moving the measured chromaticity to the target chromaticity. At this time, the additional dispensing amount of phosphor-containing resin is decided upon depending on the measured chromaticity. For example, when the measured chromaticity belongs to or exceeds the target chromaticity range, the additional dispensing amount of phosphor-containing resin becomes zero. Furthermore, as the deviation between the measured chromaticity and the target chromaticity is large, the additional dispensing amount of phosphor-containing resin increases.

Subsequently, the correction unit 440 dispenses the phosphor-containing resin to the LED package in an amount equal to the additional dispensing amount of phosphor-containing resin (S540). Accordingly, the dotting height of the LED package may be changed, and the measured chromaticity may be moved to within the target chromaticity. Then, the curing process of the LED package is performed.

As the optical property of the LED package is corrected by the above-described optical property correction apparatus of the LED package before the curing process of the phosphor-containing resin, the target chromaticity may be precisely reproduced, and the chromaticity distribution may be improved.

Figure 14:
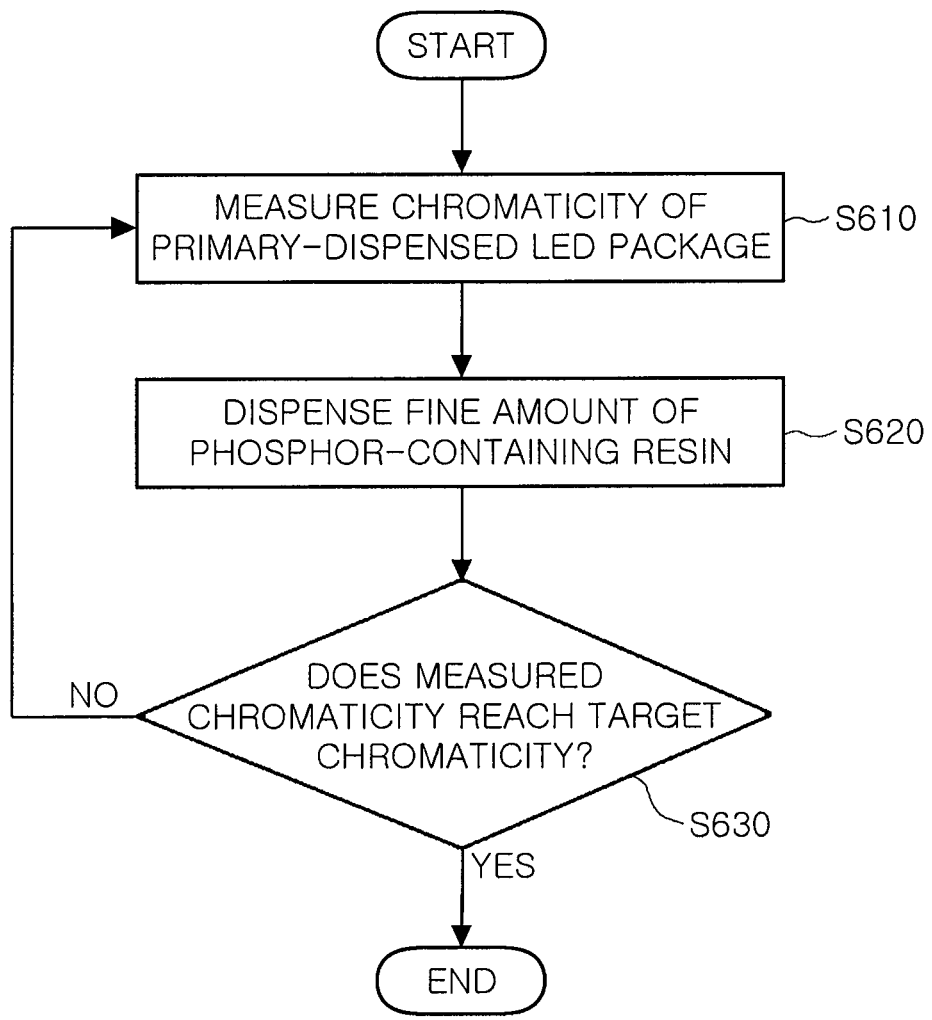
FIG. 14 is a flow chart explaining a process for presetting an additional dispensing amount of phosphor-containing resin of phosphor-containing resin for moving a measured chromaticity to a target chromaticity before the optical property correction method according to the embodiment of the present invention is performed.

FIG. 14 is a flow chart explaining a process for presetting the additional dispensing amount of phosphor-containing resin for moving the measured chromaticity to the target chromaticity by using the optical property correction apparatus of the LED package. The process of FIG. 14 corresponds to a pre-processing mode which is performed before the optical property correction method of the LED package shown in FIGS. 10 to 13 is performed.

Referring to FIG. 14, the optical property measurement unit measures the chromaticity of light emitted from the LED package to which phosphor-containing resin has been primarily dispensed (S610). Then, the optical property measurement unit transfers the measured chromaticity to the control unit.

The control unit finely controls the amount of phosphor-containing resin to be dispensed to the LED package, and the correction unit additionally dispenses the finely-controlled amount of phosphor-containing resin (S620).

Then, the LED package to which the phosphor-containing resin has been additionally dispensed is transferred to the optical property measurement unit to re-measure the chromaticity thereof. The LED package of which the chromaticity has been measured is transferred to the correction unit. When the measured chromaticity of the LED package does not fall within the target chromaticity range, an amount of phosphor-containing resin equal to that which was previously dispensed is additionally dispensed. Then, the LED package is retransferred to the optical property measurement unit to measure the chromaticity thereof.

When it is determined that the measured chromaticity has reached the target chromaticity (S630), the additional dispensing is no longer performed. When it is determined that the measured chromaticity has not reached the target chromaticity (S630), the operations 5610 and 620 are repeated until the chromaticity of all of the LED packages has reached the target chromaticity.

Then, based on the result, the correlation between the measured chromaticity and the amount of phosphor-containing resin is calculated, and the additional dispensing amount of phosphor-containing resin for moving the measured chromaticity to the target chromaticity is decided.

FIGS. 15A to 15D are diagrams showing examples in which the additional dispensing amount of phosphor-containing resin presetting method described with reference to FIG. 14 is actually applied.

Figure 15A:
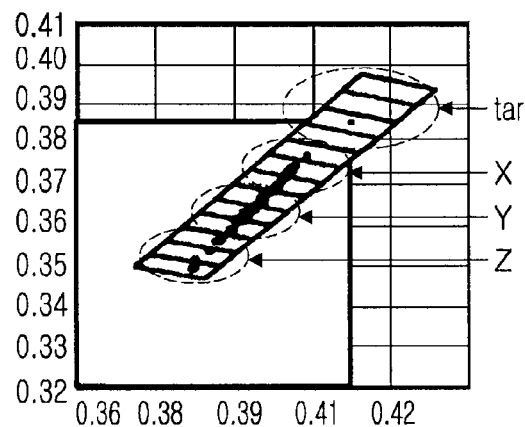
FIGS. 15A to 15D are diagrams showing examples in which an additional dispensing amount of phosphor-containing resin presetting process described with reference to FIG. 14 is actually applied.

First, the optical property measurement unit measures the chromaticity of an LED package to which phosphor-containing resin has been primarily dispensed, and transfers the result to the control unit. At this time, a plurality of LED packages are provided in an array. FIG. 15A shows a chromaticity distribution obtained by measuring the chromaticities of the plurality of LED packages.

Referring to FIG. 15A, the measured chromaticities deviate from the target chromaticity range, and are classified into groups X, Y, and Z.

Figure 15B:
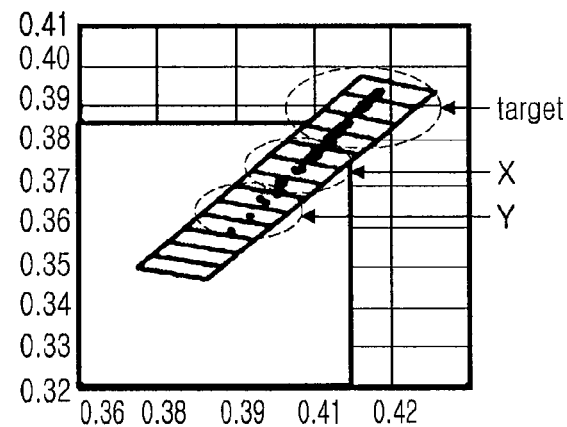

The correction unit dispenses a constant fine amount of phosphor-containing resin to the LED packages of which the measured chromaticities do not belong to the target chromaticity. At this time, the same amount of phosphor-containing resin is dispensed to the respective LED packages. The LED packages to which the phosphor-containing resin has been dispensed are retransferred to the optical property measurement unit to re-measure the chromaticities. FIG. 15B shows the measurement result.

Referring to FIG. 15B, it can be seen that the chromaticity distributions of the measured chromaticities approach the target chromaticity range in comparison with the chromaticity distributions of FIG. 15A. That is, the group X is moved into the target chromaticity range, the group Y is moved into the chromaticity range of the group X, and the group Z is moved into the chromaticity range of the group Y, by one additional dispensing process.

Figure 15C:
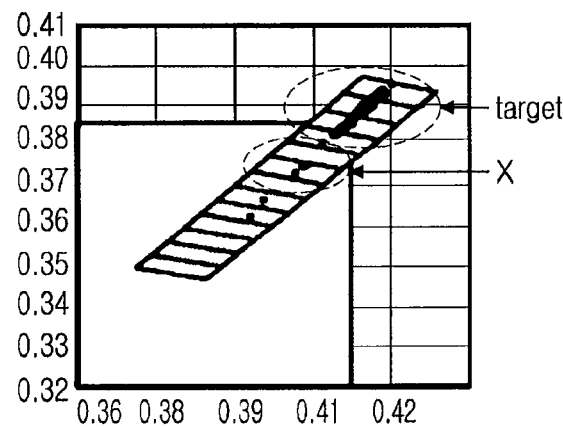

Accordingly, the correction unit re-dispenses the constant fine amount of phosphor-containing resin to the LED packages of which the chromaticities do not belong to the target chromaticity. At this time, the amount of phosphor-containing resin dispensed to the respective LED packages is equal to the amount of phosphor-containing resin dispensed during the previous additional dispensing process. The LED packages to which the phosphor-containing resin has been additionally dispensed are retransferred to the optical property measurement unit to re-measure the respective chromaticity amounts thereof. FIG. 15C shows the measurement result.

Referring to FIG. 15C, it can be seen that the chromaticity distributions of the measured chromaticity amounts approach the target chromaticity range in comparison with the chromaticity distribution of FIG. 15B. That is, the group Y of FIG. 15A is moved into the target chromaticity range, and the group Z of FIG. 15A is moved into the chromaticity range of the group X, by two additional dispensing processes.

Figure 15D:
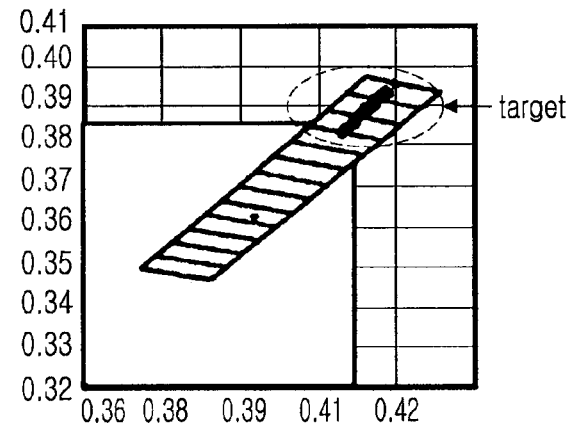

Accordingly, the correction unit re-dispenses the constant fine amount of phosphor-containing resin to the LED packages (the group Z) of which the chromaticities do not belong to the target chromaticity. At this time, the amount of phosphor-containing resin dispensed to the respective LED packages is equal to the amount of phosphor-containing resin dispensed during the previous additional dispensing process. The LED packages to which the phosphor-containing resin has been additionally dispensed are retransferred to the optical property measurement unit to re-measure the chromaticities. FIG. 15D shows the measurement result.

Referring to FIG. 15D, it can be seen that all the chromaticity distributions of the measured chromaticities are moved into the target chromaticity range. That is, the group X is moved into the target chromaticity range by one additional dispensing process, the group Y is moved into the target chromaticity range by two additional dispensing processes, and the group Z is moved into the target chromaticity range by three additional dispensing processes.

Through the above-described process, the additional dispensing amount of phosphor-containing resin for moving the measured chromaticity to the target chromaticity is set and then stored in the control unit. Therefore, when the optical property correction of LED packages is actually performed, an additional dispensing amount of phosphor-containing resin may be calculated depending on the measured chromaticity of the respective LED packages.

FIGS. 16 and 17 show chromaticity distributions before and after the optical property correction of LED packages. The drawings show results obtained by actually applying the optical property correction method according to the embodiment of the present invention.

Figure 16A:
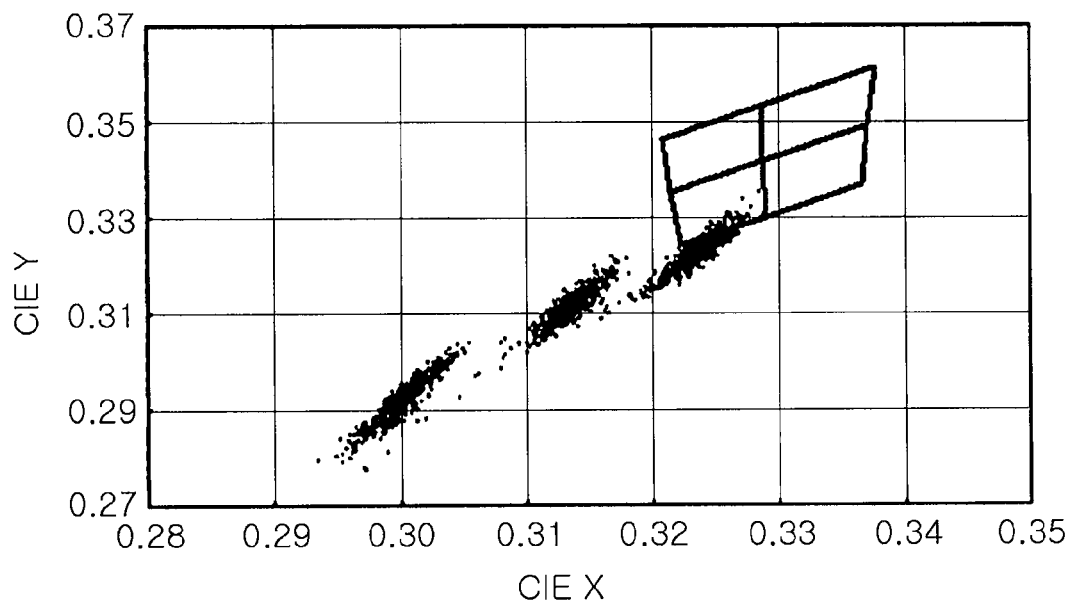
FIGS. 16A, 16B, 17A, and 17B show chromaticity distributions before and after the optical property correction of LED packages.
Figure 16B:
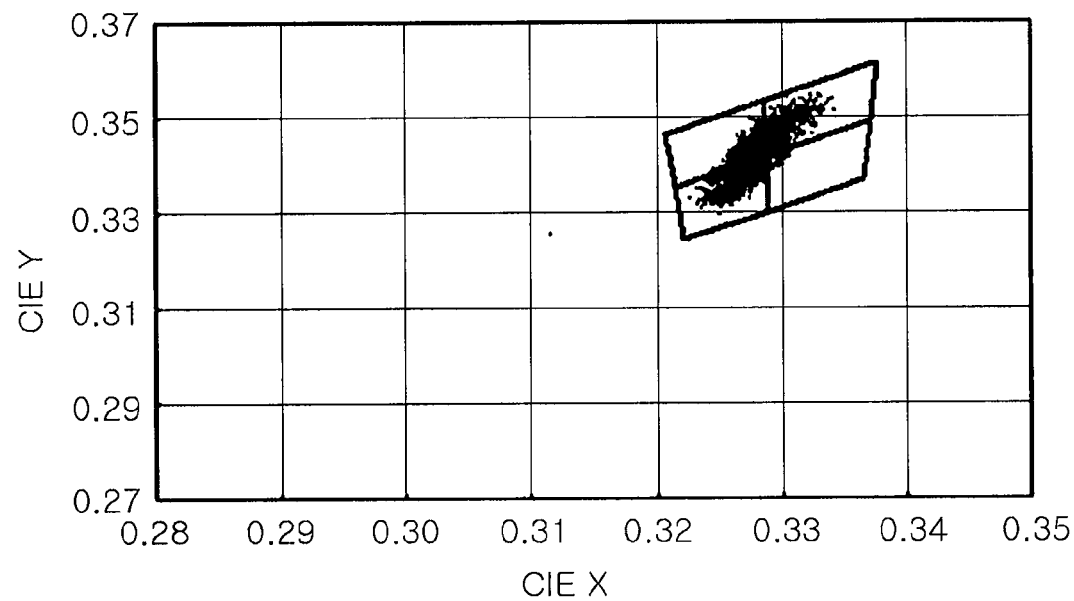
Figure 17A:
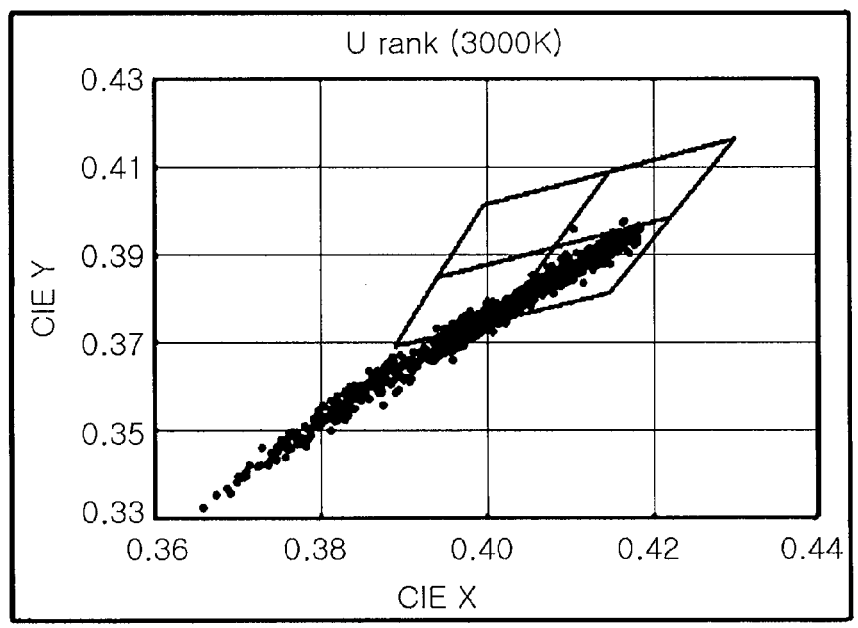
Figure 17B:
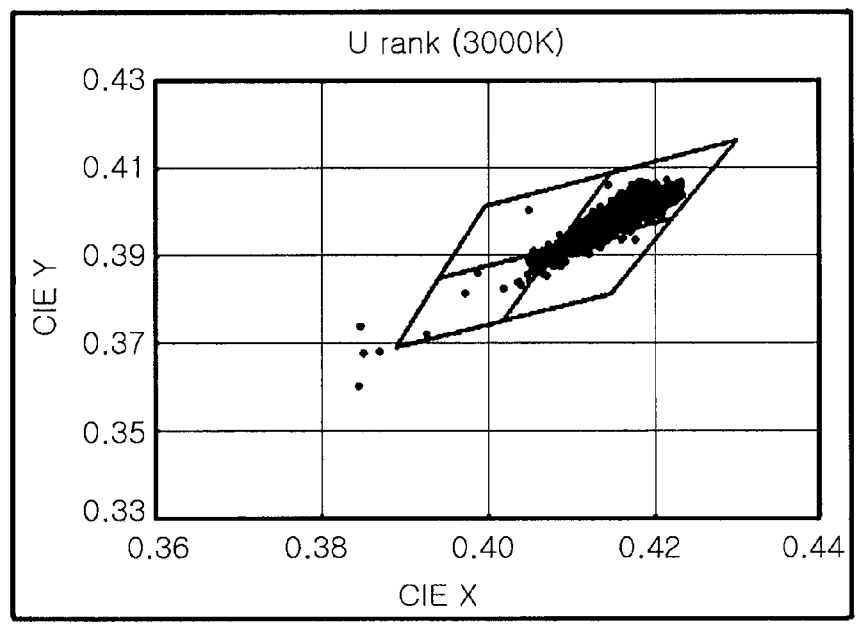

FIGS. 16A and 17A show the chromaticity distribution of LED packages in which the primary dispensing process has been performed, and FIGS. 16B and 17B show the chromaticity distribution corrected by the optical property correction apparatus according to the embodiment of the present invention.

Referring to FIGS. 16A and 17A, the chromaticities of the LED packages in which the primary dispensing process has been performed have a wide distribution deviating from the target chromaticity range. Referring to FIGS. 16B and 17B, however, when the phosphor-containing resin is additionally dispensed by the optical property correction apparatus, the chromaticities deviating from the target chromaticity range are moved into the target chromaticity range.

Figure 18A:
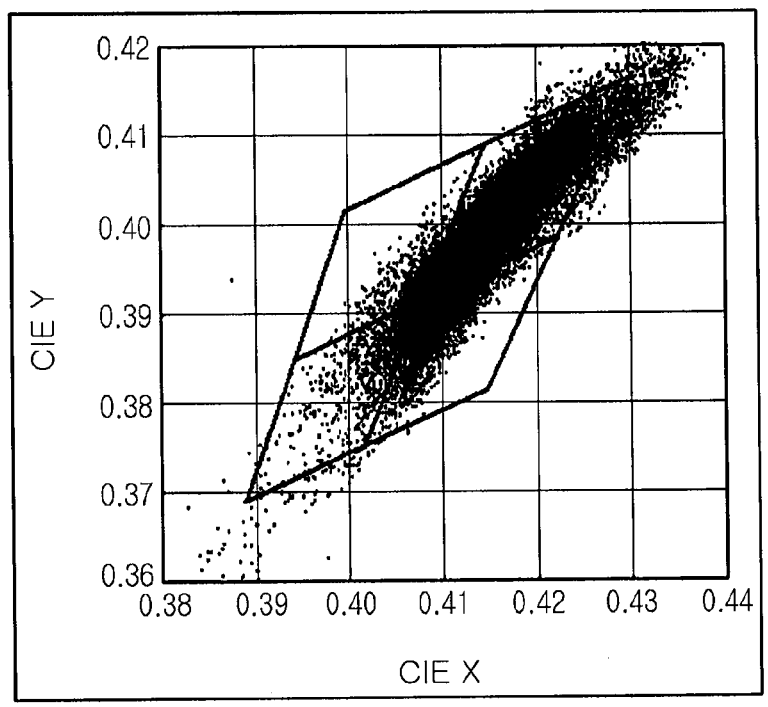
FIGS. 18A and 18B show the chromaticities of LED packages in a case in which a general dispensing process is performed and in a case in which the optical property correction is performed according to the embodiment of the present invention, respectively.
Figure 18B:
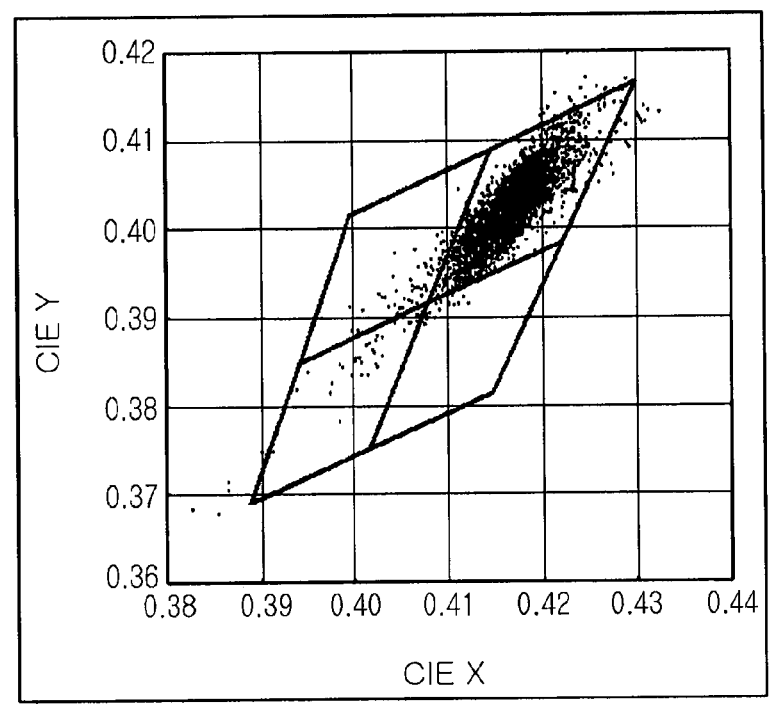

FIGS. 18A and 18B show the chromaticities of LED packages in a case in which a general dispensing process is performed and in a case in which the optical property correction is performed according to the embodiment of the present invention, respectively.

Referring to FIG. 18A, when a general dispensing process is performed, the chromaticities of the LED packages have a wide distribution with respect to the target chromaticity range. Referring to FIG. 18B, however, when the optical property correction is performed according to the embodiment of the present invention, the chromaticities of the LED packages have a dense distribution with respect to the target chromaticity range.

Figure 19:
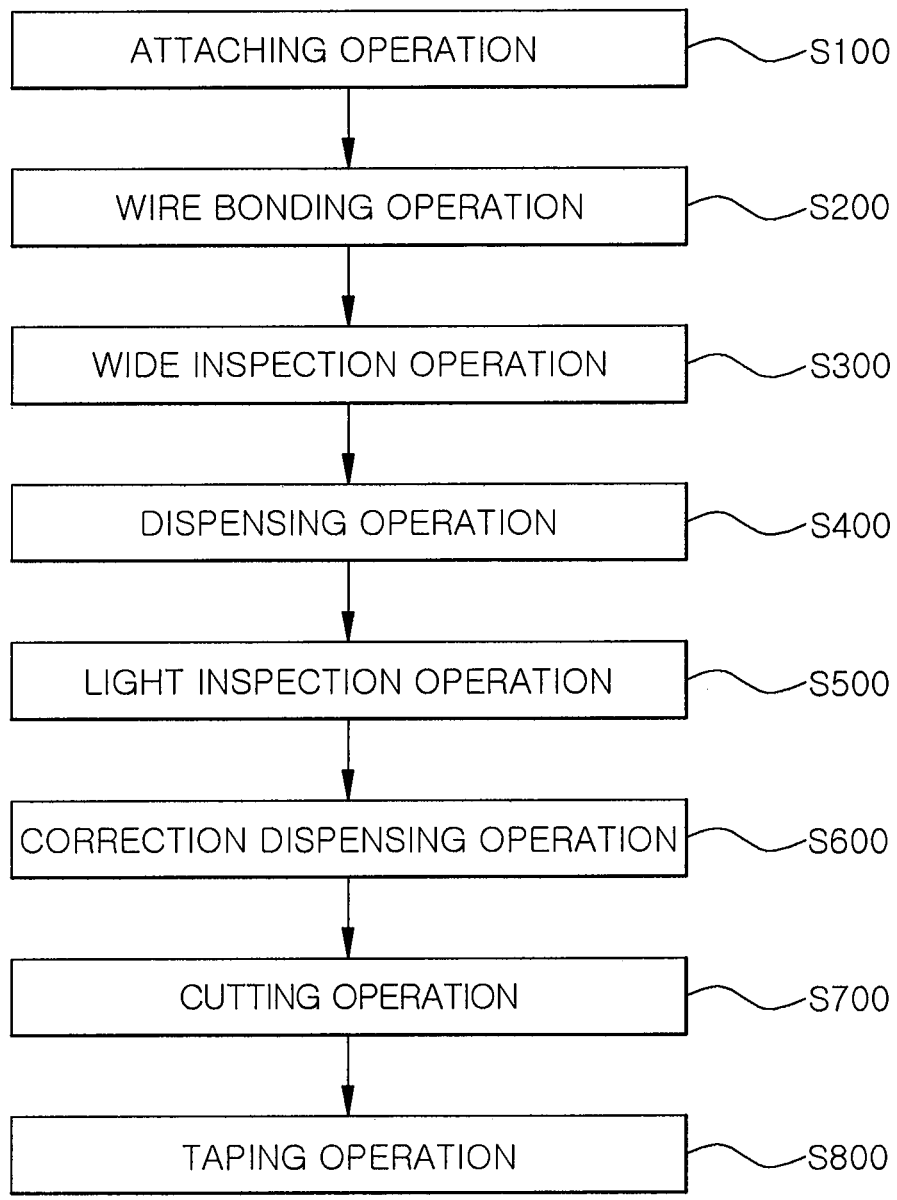
FIG. 19 is a flow chart showing a method for manufacturing an LED package according to another embodiment of the present invention.
Figure 20:
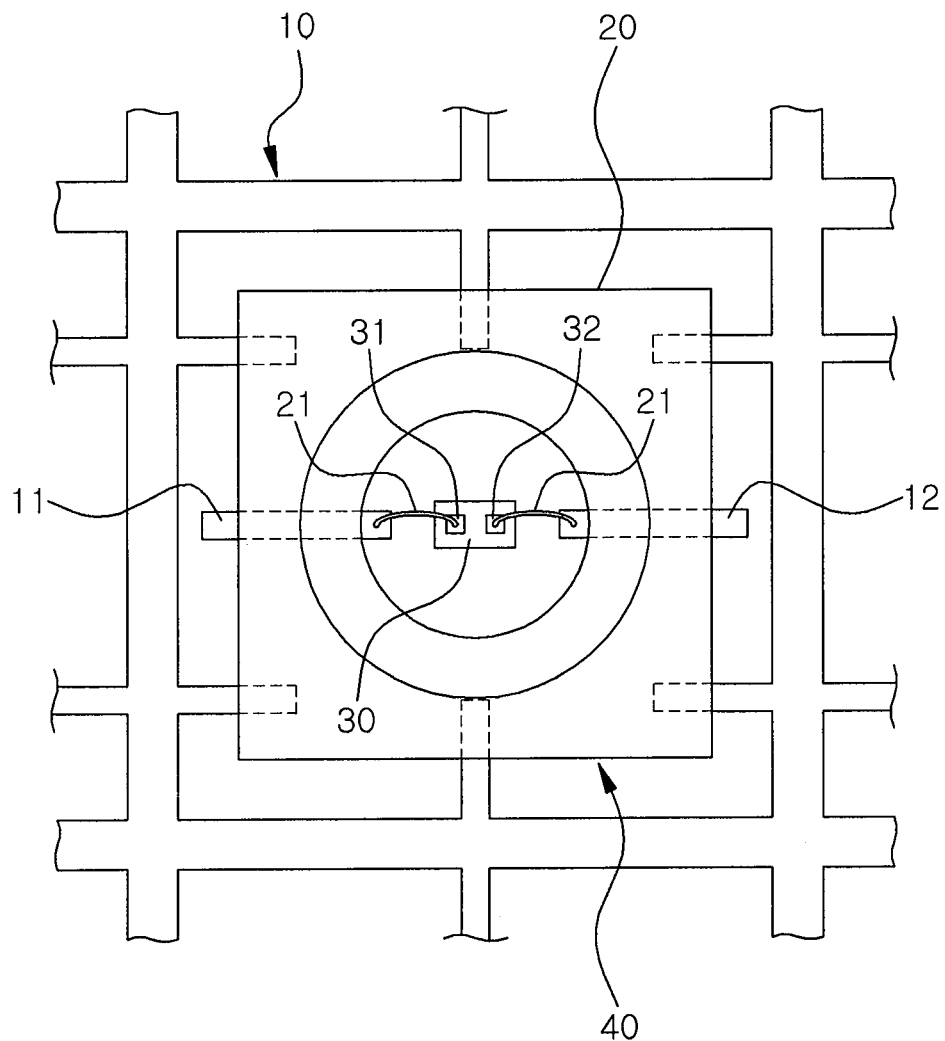
FIG. 20 is a plan view explaining a process for manufacturing an LED package according to the method for manufacturing an LED package shown in FIG. 19.

According to another embodiment of the present invention, a method for manufacturing an LED package is provided, which is capable of increasing the productivity of the entire LED package manufacturing process. FIG. 19 is a flow chart showing a method for manufacturing an LED package according to another embodiment of the present invention. FIG. 20 is a plan view explaining a process for manufacturing an LED package according to the method for manufacturing an LED package shown in FIG. 19.

Referring to FIGS. 19 and 20, the method for manufacturing an LED package according to the embodiment of the present invention relates to a method for manufacturing LED packages 40 having LED chips 30.

First, the LED chips 30 are attached to a plurality of package bodies 20 of a package array 10 (S100). In this embodiment of the present invention, the package array (10, 40) uses a lead frame 10 as illustrated in FIG. 20. The plurality of package bodies 20 or synthetic resin moldings are arranged at even intervals in the lead frame 10 formed of a metallic thin plate so as to form an array. FIG. 20 illustrates a portion of the entire lead frame 10. A plurality of such portions are repetitively formed to compose the entire lead frame 10.

Next, a wire bonding operation (S200) is performed to electrically connect electrodes 11 and 12 of the package body 20 to electrodes 31 and 32 of the LED chip 30 through wires 21. When the wire bonding operation 5200 is completed, a wire inspection operation (S300) is performed to inspect whether a wire bonding failure has occurred or not. The wire inspection operation S300 is performed by a laser scanner or a method of determining whether a wire is cut or not through image processing for an image photographed by a camera. As the inspection result, when the wire bonding of an LED chip 30 is determined to be a failure, the subsequent process for the LED chip 30 is omitted, which makes it possible to enhance the productivity and quality of the process.

Then, a dispensing operation (S400) is performed to dispense phosphor-containing transparent resin 41 (refer to FIG. 22) to the respective package bodies 20 having the LED chip 30 mouthed thereon. The optical property of the LED package 40 is represented by a chromaticity of the 1931 CIE chromaticity diagram. Depending on the amount of phosphor-containing resin to be dispensed, the chromaticity of light emitted from the LED chip 30 differs. Therefore, in order to manufacture an LED package 40 emitting a desired color of light, it is important to dispense an accurate amount of phosphor-containing resin.

Figure 22:
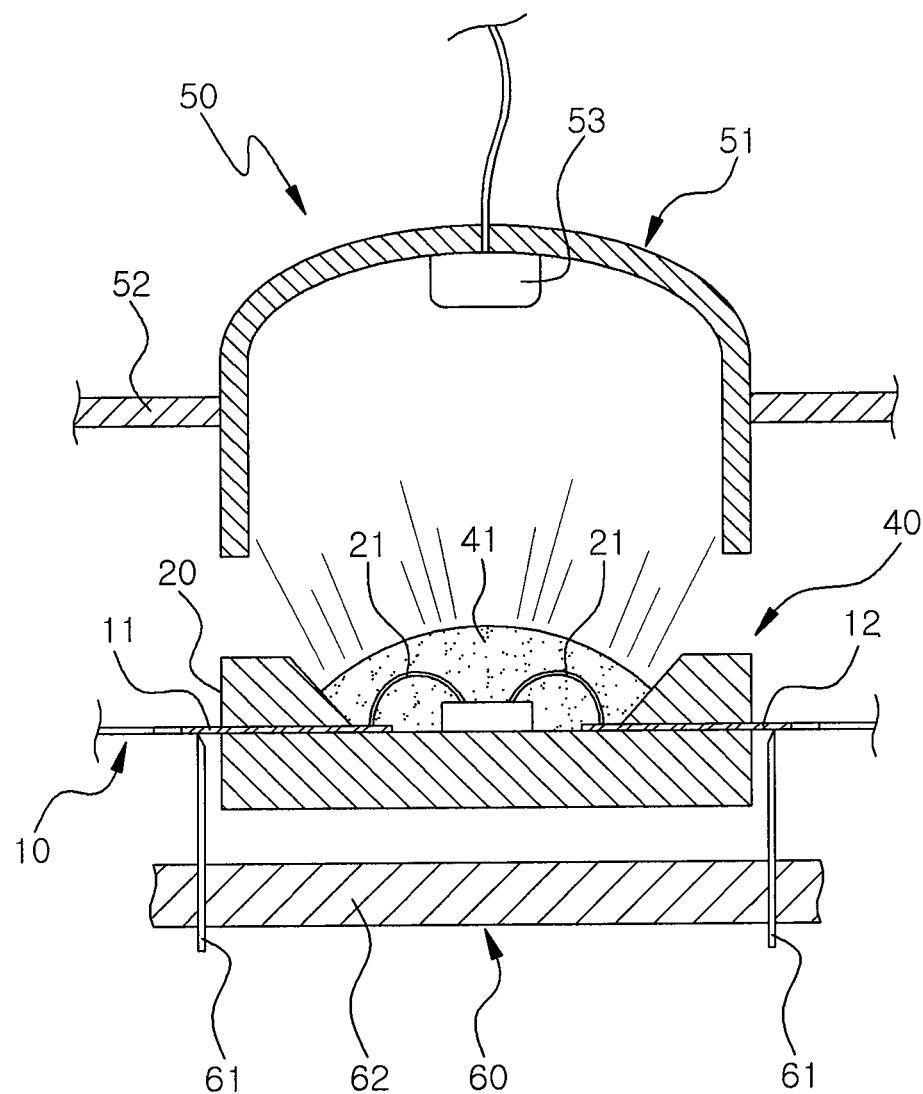
FIG. 22 is a cross-sectional view explaining a light inspection operation in the method for manufacturing an LED package shown in FIG. 19.

After the dispensing operation (S400), a light inspection operation (S500) is performed to inspect the optical properties of the LED packages 40 in a state in which a voltage is applied to the respective LED chips 30 to emit light. In the light inspection operation (S500), a lead frame 10 in which the electrodes 11 and 12 of the lead frame 10 connected to the electrodes 31 and 32 of the respective LED chips 30 are electrically isolated from each other may be used as illustrated in FIG. 20. Referring to FIG. 22, a probe card 60 including a plurality of probe pins 61 may be positioned close to the lead frame 10, and a voltage may be applied to the respective electrodes 11 and 12 such that the LED chip 30 emits light. A light inspection unit 51 configured to detect the property of light emitted from the LED package 40 is positioned close to the LED package 40 so as to inspect the optical property of the LED package 40.

Figure 21:
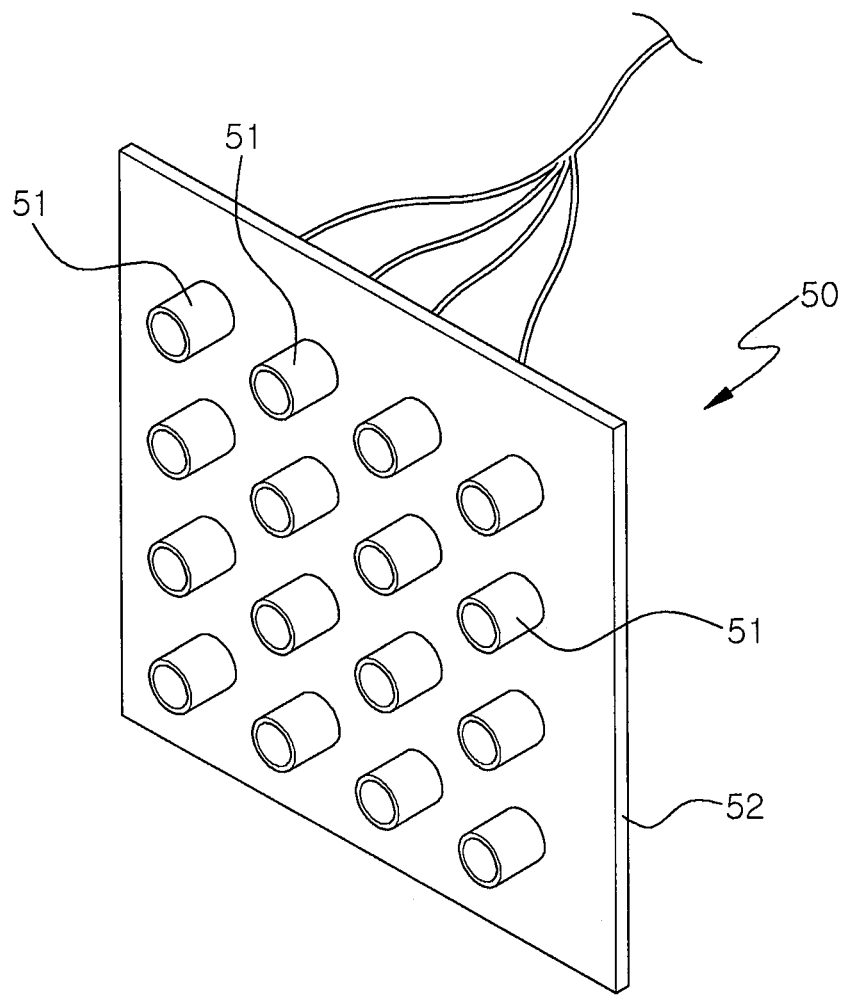
FIG. 21 is a perspective view of a light receiving array which may be used for the method for manufacturing an LED package according to the embodiment of the present invention.

FIG. 21 illustrates an example of alight receiving array 50 including a plurality of light inspection units 51. The plurality of light inspection units 51 are fixed to a plate 52. The plurality of light inspection units 51 are arranged on the plate 52 so as to correspond to the respective package bodies 20 installed in the lead frame 10 one by one.

Referring to FIG. 22, the probe card 60 is positioned close to the lower side of the lead frame 10 to perform the light inspection operation 5500 in a state in which the light receiving array 50 is positioned close to the lead frame 10. The probe card 60 includes the plurality of probe pins 61 fixed to a space transformer 62, and the respective probe pins 61 are disposed to correspond to the positions of the electrodes 11 and 12 of the lead frame 10. When the probe pins 61 come into contact with the electrodes 11 and 12 of the lead frame 10 so as to apply a voltage, the LED chip 30 emits light. The light inspection unit 51 of the light receiving array 50 detects the light through a photosensitive sensor 53, and determines the optical property of the LED package 40.

Since the respective electrodes 11 and 12 of the lead frame 10 are electrically isolated from each other as described above, the light inspection operation (S500) may be performed even in a state in which the respective LED packages 40 are not cut from the lead frame 10 (that is, the LED packages 40 are not singulated). In other words, since the electrodes 11 and 12 of the lead frame 10 are electrically isolated from each other, the LED packages 40 may emit light, and the optical properties of the LED packages 40 may be inspected even in a state in which the LED packages 40 are not cut from the lead frame 10. Accordingly, the productivity of the LED package manufacturing process increases. Furthermore, when the above-described light receiving array 50 is used, the light inspection operation (S500) may be performed on the plurality of LED packages 40 at the same time. Therefore, compared with the case in which the respective LED packages 40 are inspected one by one, it is possible to significantly reduce the optical property inspection time.

When the above-described light inspection operation (S500) is completed, it is possible to find an LED package 40 which does not emit light. Furthermore, it is possible to find an LED package 40 which emits light having a chromaticity deviating from the predetermined target chromaticity range, because the amount of phosphors is insufficient. As the result of the light inspection operation S500, when it is determined that the amount of phosphors is insufficient, a correction dispensing operation (S600) may be performed to supplement phosphors to the LED package 400. The amount of phosphors to be supplemented may be calculated, and transparent resin (for example, silicon resin) 41 containing the calculated amount of phosphors may be dispensed in such a manner that the LED package 400 has a chromaticity within the predetermined target chromaticity range. At this time, the correction dispensing operation (S600) may be omitted for the LED packages 400 which do not emit light in the light inspection operation (S500). In this case, the process efficiency may be improved. After the correction dispensing operation (S600) is performed on the LED packages 40, the light inspection operation (S500) may be performed on the LED packages 40 to inspect the optical properties of the LED packages again.

Next, a cutting operation (S700) is performed to separate the LED packages 40 from the lead frame 10, and a taping operation (S800) is performed to pack the cut and separated (singulated) LED packages 40. In the cutting operation (S700), portions of the lead frame between the respective package regions connecting the LED packages 40 are cut so as to obtain the LED packages singulated from the package array. For products which are determined to be a failure in the wire inspection operation (S300) and the light inspection operation (S500), the cutting operation (S700) and the taping operation (S800) are not performed, but only good products are packed and shipped. Therefore, it is possible to reduce a failure rate of the shipped products.

Although the present invention has been described with reference to the embodiments, the scope of the present invention is not limited to the embodiments. For example, it has been described in the above embodiments that the electrodes 11 and 12 of the lead frame 10 to be connected to the electrodes 31 and 32 of the LED package 40 are electrically isolated from each other. In some cases, however, the respective LED packages may be configured in such a manner that the positive electrodes thereof are connected to each other, the negative electrodes thereof are connected to each other, and the positive electrodes are isolated from the negative electrodes. That is, a lead frame in which the LED packages are connected in parallel may be used. Even in this case, the optical properties of the LED packages may be inspected before the cutting operation, that is, the singulation operation of the LED packages. In particular, the LED packages may be collectively inspected for one array.

Furthermore, it has been described in the above embodiments that the LED chip 30 is electrically connected to the electrodes of the package body 20 through the wires 21. However, the LED chip 30 may be connected to the electrodes of the package body 20 through flip-chip bonding. When the LED chip is installed in the package array through the flip-chip bonding, the above-described wire inspection operation is not performed.

Furthermore, it has been described in the above embodiments that the package array uses the lead frame 10. However, a substrate may be used in place of the lead frame 10. That is, the LED chip may be attached on the substrate having electrode patterns printed thereon, and be electrically connected thereto through wire bonding or flip-chip bonding. Even in this case, the electrode patterns printed on the substrate may be configured in such a manner that the respective electrodes are electrically isolated from each other. Alternatively, the electrode patterns printed on the substrate may be configured in such a manner that electrodes having the same polarity are connected to each other, but electrodes having different polarities are insulated from each other.

Furthermore, it has been described in the above embodiments that the light inspection operation (S500) is performed using the light receiving array 50 as illustrated in FIG. 21. While one light inspection unit fixed to a transfer device is moved to the position of each LED package, the light inspection operation may be performed.

Furthermore, it has been described in the above embodiments that the light inspection operation (S500) is performed in a state in which the light receiving array 50 is disposed above the lead frame 10 and the probe card 60 is disposed under the lead frame 10, as illustrated in FIG. 22. However, the light inspection operation (S500) may not necessarily be performed in such a manner. In some cases, the light receiving array and the probe card may be integrated to detect the optical property of the LED package while power is applied from the upper side of the lead frame.

The structure of the lead frame 10 illustrated in FIG. 20 is only an example of the lead frame 10 having a structure in which the electrodes are electrically isolated and which may support the LED package 20. The lead frame 10 may be formed in various shapes.

While the present invention has been shown and described in connection with the exemplary embodiments, it will be apparent to those skilled in the art that modifications and variations can be made without departing from the spirit and scope of the invention as defined by the appended claims.

What is claimed is:

1. An LED package manufacturing method for an LED package array comprising a plurality of LED packages, the method comprising steps of:
    applying an electrical signal to the plurality of LED packages, and measuring a chromaticity of light emitted from each of the plurality of LED packages, wherein the plurality of LED packages are provided for measuring in a state in which phosphor-containing resin non-cured;
    calculating an additional amount of phosphor-containing resin to be dispensed to the LED packages deviating from the target chromaticity by comparing the measured chromaticity with a predetermined target chromaticity; and
    dispensing phosphor-containing resin to each of the LED packages deviating from the target chromaticity in an amount corresponding to the calculated additional amount of phosphor-containing resin to be dispensed, wherein the LED packages are provided for measuring in a state in which phosphor-containing resin is non-cured.

2. The LED package manufacturing method of claim 1, further comprising primarily dispensing the phosphor-containing resin to the LED package, before the measuring of the chromaticity.

3. The LED package manufacturing method of claim 1, wherein, in the calculating of the additional amount of phosphor-containing resin to be dispensed,
    the additional amount of phosphor-containing resin is decided so that the measured chromaticity falls within a target chromaticity range.

4. The LED package manufacturing method of claim 1, wherein a package array in which a plurality of LED packages are arranged in an array is provided for measuring the chromaticity of light, a positive electrode and a negative electrode of each LED package in the package array being electrically insulated from each other.

5. The LED package manufacturing method of claim 4, wherein the respective LED packages are electrically insulated from each other.

6. The LED package manufacturing method of claim 1, further comprising presetting an additional amount of phosphor-containing resin to be dispensed for moving the measured chromaticity to the target chromaticity, before the measuring of the chromaticity of light emitted from LED package.

7. The LED package manufacturing method of claim 6, wherein the presetting of the additional amount of phosphor-containing resin to be dispensed comprises:
    a first operation of measuring a chromaticity of light emitted from the LED package to which phosphor-containing resin is primarily dispensed;
    a second operation of additionally dispensing a constant fine amount of phosphor-containing resin to the LED package;
    a third operation of measuring a chromaticity of light emitted from the LED package to which the constant fine amount of phosphor-containing resin is dispensed;
    when the chromaticity measured in the third operation does not reach the target chromaticity, repeating the second and third operations until the chromaticity measured in the third operation reaches the target chromaticity; and
    setting an additional dispensing amount of phosphor-containing resin for moving the measured chromaticity to the target chromaticity, by using the correlation between the amount of phosphor-containing resin and the chromaticity measured when the chromaticity reaches the target chromaticity.

8. The LED package manufacturing method of claim 1, wherein, when measuring a chromaticity of light emitted from each of the plurality of LED packages, a positive electrode and a negative electrode of each LED package in the package array are electrically insulated from each other.

9. The LED package manufacturing method of claim 1, wherein respective LED packages are electrically insulated from each other.

* * * * *